US009246622B2

(12) United States Patent
Uchiyama et al.

(10) Patent No.: US 9,246,622 B2
(45) Date of Patent: Jan. 26, 2016

(54) SEMICONDUCTOR OPTICAL ELEMENT, OPTICAL MODULE AND METHOD OF MANUFACTURING SEMICONDUCTOR OPTICAL ELEMENT

(71) Applicant: Mitsubishi Electric Corporation, Tokyo (JP)

(72) Inventors: Asami Uchiyama, Tokyo (JP); Koichi Akiyama, Tokyo (JP); Yusuke Azuma, Tokyo (JP); Yoshimichi Morita, Tokyo (JP); Takeshi Yamatoya, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 32 days.

(21) Appl. No.: 14/266,872

(22) Filed: May 1, 2014

(65) Prior Publication Data

US 2015/0093115 A1    Apr. 2, 2015

(30) Foreign Application Priority Data

Sep. 27, 2013  (JP) .................................. 2013-201572

(51) Int. Cl.
*H04J 14/02* (2006.01)
*H04B 10/70* (2013.01)

(52) U.S. Cl.
CPC ................ *H04J 14/02* (2013.01); *H04B 10/70* (2013.01)

(58) Field of Classification Search
CPC ....... H04J 14/02; H04B 10/70; H04B 10/504; H04B 10/506
See application file for complete search history.

(56) References Cited

U.S. PATENT DOCUMENTS

| 5,953,359 | A | 9/1999 | Yamaguchi et al. | |
|---|---|---|---|---|
| 6,516,017 | B1 | 2/2003 | Matsumoto | |
| 6,757,499 | B1 * | 6/2004 | Aoki | H04B 10/504 372/32 |
| 2001/0012306 | A1 * | 8/2001 | Yamazaki | H01S 5/227 372/43.01 |
| 2002/0064201 | A1 * | 5/2002 | Matsumoto | H01S 5/0265 372/50.1 |
| 2002/0179929 | A1 * | 12/2002 | Takahashi | B82Y 20/00 257/184 |
| 2003/0095736 | A1 * | 5/2003 | Kish, Jr. | B82Y 20/00 385/14 |
| 2008/0219315 | A1 * | 9/2008 | Makino | B82Y 20/00 372/50.1 |
| 2008/0291952 | A1 * | 11/2008 | Yamamoto | B82Y 20/00 372/26 |
| 2012/0099185 | A1 * | 4/2012 | Yokoyama | B82Y 20/00 359/340 |
| 2012/0099610 | A1 * | 4/2012 | Kono | B82Y 20/00 372/18 |

FOREIGN PATENT DOCUMENTS

| JP | 10-117040 A | 5/1998 |
|---|---|---|
| JP | 2001-144367 A | 5/2001 |
| JP | 2001-326414 A | 11/2001 |
| JP | 2012-4279 A | 1/2012 |

* cited by examiner

*Primary Examiner* — Dzung Tran
(74) *Attorney, Agent, or Firm* — Leydig, Voit & Mayer, Ltd.

(57) ABSTRACT

A semiconductor optical element and an optical module in which extinction ratio variation among integrated optical modulation elements is reduced. An optical module has a wavelength multiplexer that multiplexes light respectively emerging from electric-field-absorption modulator (EAM) portions of integrated optical modulation elements, and that outputs the multiplexed light. The integrated optical modulation element has a signal input terminal, a laser element portion, and an EAM portion. Each of the integrated optical modulation elements has a difference between an oscillation wavelength and a barrier layer bandgap wavelength, represented as an LDBG wavelength difference. Variation of the LDBG wavelength differences is limited within a range of ±1 nm.

24 Claims, 18 Drawing Sheets

B-B'

SEMICONDUCTOR OPTICAL ELEMENT, OPTICAL MODULE AND METHOD OF MANUFACTURING SEMICONDUCTOR OPTICAL ELEMENT

BACKGROUND OF THE INVENTION

1. Field of the Invention

The present invention relates to a semiconductor optical element, an optical module and a method of manufacturing the semiconductor optical element.

2. Background Art

In the conventional optical communication, a communication system called a wavelength division multiplexing communication system is used. In wavelength division multiplexing communication systems, one optical fiber cable simultaneously accommodates optical signals with a plurality of different wavelengths.

In recent years, in wavelength division multiplexing communication systems, the difference between the oscillation wavelength of the shortest-wavelength laser element and the oscillation wavelength of the longest-wavelength laser element has become larger. More specifically, for example, this oscillation wavelength difference is as large as 15 nm in some communication standard.

As an optical module used for wavelength division multiplexing communication, an optical module having a plurality of integrated optical modulation elements combined in one package is known. A typical one of integrated optical modulation elements is an element formed by growing a laser element portion and an electric field absorption type of optical modulator portion provided side by side on a semiconductor substrate.

An optical module formed by arranging a plurality of integrated optical modulation elements on one semiconductor substrate, for example, as disclosed in Japanese Patent Laid-Open Publication No. 10-117040 in conjunction with FIG. 4 or the like is conventionally known. A wavelength division multiplexing communication system needs a plurality of different light sources and, therefore, has a plurality of laser element portions with different oscillation wavelengths integrated therein. Optical modulation can be performed on laser lights of different wavelengths from the laser element portions by using electric-field-absorption-type optical modulators.

According to paragraph 0019 in the publication, the electric-field-absorption-type optical modulation portions of the integrated optical modulation elements respectively have light absorption end wavelengths different from each other in the device according to the publication. Further, according to paragraph 0020 in the publication, the differences between the oscillation wavelengths and the light absorption end wavelengths are set within a certain range in the device according to the publication.

Other prior art includes Japanese Patent Laid-Open Publication No. 10-117040, Japanese Patent Laid-Open Publication No. 2001-144367, and Japanese Patent Laid-Open Publication No. 2001-326414.

As characteristic values of the electric-field-absorption-type optical modulator, the bandgap wavelength $\lambda_{BG}$ of barrier layers and the photoluminescence wavelength $\lambda_{PL}$ of light absorption layers in a case where a multi-quantum-well core layer is used as a light absorption layer exist. There are differences between the oscillation wavelengths that the plurality of laser element portions respectively have and the two characteristic values $\lambda_{BG}$ and $\lambda_{PL}$ that the plurality of electric-field-absorption-type optical modulators respectively have.

The inventors of the present invention earnestly studied and found that the differences between the oscillation wavelengths and the two characteristic values $\lambda_{BG}$ and $\lambda_{PL}$ influence characteristics, such as extinction ratio variation among the plurality of optical modulators.

As described above, the difference between the oscillation wavelength of the shortest-wavelength laser element and the oscillation wavelength of the longest-wavelength laser element has become larger in recent years. It is, therefore, necessary to attach importance to the differences between the oscillation wavelengths and the two characteristic values $\lambda_{BG}$ and $\lambda_{PL}$ that have not been taken into consideration. The inventors of the present invention has found that in an optical module having a plurality of integrated optical modulation elements, extinction ratio variation can be reduced by using new design parameters that have not been used.

SUMMARY OF THE INVENTION

The present invention has been achieved to solve the above-described problem, and an object of the present invention is to provide a semiconductor optical element and an optical module in which extinction ratio variation among a plurality of integrated optical modulation elements is reduced.

Another object of the present invention is to provide a manufacturing method suitable for reducing extinction ratio variation in a method of manufacturing a semiconductor optical element having a plurality of laser element portions and a plurality of electric-field-absorption-type optical modulators.

According to a first aspect of the present invention, a semiconductor optical element includes a plurality of integrated optical modulation elements. Each of the plurality of integrated optical modulation elements includes: a laser element portion from which laser light having an oscillation wavelength emerges; and an electric-field-absorption-type optical modulator portion having a quantum well core layer that receives laser light from the laser element portion. The optical modulator portion performs optical modulation according to an input electrical signal. The oscillation wavelength of the laser element portion that a second integrated optical modulation element among the plurality of integrated optical modulation elements has is longer than the oscillation wavelength of the laser element portion that a first integrated optical modulation element among the plurality of integrated optical modulation elements has. A bandgap wavelength of a barrier layer in the quantum well core layer that the second integrated optical modulation element has is longer than a bandgap wavelength of a barrier layer in the quantum well core layer that the first integrated optical modulation element has.

According to a second aspect of the present invention, an optical module includes: a plurality of integrated optical modulation elements; and a wavelength multiplexer that multiplexes lights emergent from respective electric-field-absorption-type optical modulator portions of the plurality of integrated optical modulation elements. Each of the plurality of integrated optical modulation elements includes: a signal input terminal; a laser element portion from which laser light having an oscillation wavelength emerges; and the electric-field-absorption-type optical modulator portion having a quantum well core layer that receives laser light from the laser element portion, the optical modulator portion performing optical modulation according to an input electrical signal from the signal input terminal. The oscillation wavelength of the laser element portion that a second integrated optical modulation element among the plurality of integrated optical modulation elements has is longer than the oscillation wavelength of the laser element portion that a first integrated optical modulation element among the plurality of integrated optical modulation elements has. A bandgap wavelength of a barrier layer in the quantum well core layer that the second integrated optical modulation element has is longer than a bandgap wavelength of a barrier layer in the quantum well core layer that the first integrated optical modulation element has.

According to a third aspect of the present invention, a method of manufacturing a semiconductor optical element having a plurality of integrated optical modulation elements monolithically integrated on one semiconductor substrate includes the steps as follows. The plurality of integrated optical modulation elements includes: a first integrated optical modulation element having a first laser element portion and a first electric-field-absorption-type optical modulation portion; and a second integrated optical modulation element having a second laser element portion differing in oscillation wavelength from the first laser element portion and a second electric-field-absorption-type optical modulation portion. The first electric-field-absorption-type optical modulation portion has a first quantum well core layer including a barrier layer having a first bandgap wavelength. The second electric-field-absorption-type optical modulation portion has a second quantum well core layer including a barrier layer having a second bandgap wavelength different from the first bandgap wavelength. The method includes the steps of: growing the first quantum well core layer on the semiconductor substrate; forming a mask in a region on the semiconductor substrate other than a region where the second quantum well core layer is to be grown, and removing the first quantum well core layer by etching; and performing, by using the mask, butt-joint growing of the second quantum well core layer on a surface exposed by the etching According to a fourth aspect of the present invention, a method of manufacturing a semiconductor optical element having a plurality of laser element portions and a plurality of electric-field-absorption-type optical modulator portions monolithically integrated on one semiconductor substrate includes the steps as follows. The method comprising the steps of: growing a quantum well core layer on the semiconductor substrate; providing a plurality of masks in formation target regions on the quantum well core layer where the plurality of electric-field-absorption-type optical modulator portions are to be formed; etching the quantum well core layer in the formation target regions by using the plurality of masks; and forming, after the etching, the electric-field-absorption-type optical modulator portions, with the quantum well core layer being formed as a light absorption layer in the formation target regions. Each of the plurality of masks includes a first mask portion and a second mask portion. The first mask portion extends on the quantum well core layer along the direction of traveling of light to be modulated. The second mask portion extends parallel to the first mask portion, is spaced apart from the first mask portion and is equal in width to the first mask portion in a surface of the semiconductor substrate. The first mask portion and the second mask portion in a first one of the plurality of masks have a first width. The first mask portion and the second mask portion in a second one of the plurality of masks have a second width different from the first width. A bandgap wavelength of a barrier layer in the quantum well core layer in a first electric-field-absorption-type optical modulation portion having the quantum well core layer etched with the first mask is a first bandgap wavelength. An oscillation wavelength of the laser element portion from which laser light is applied to the first electric-field-absorption-type optical modulation portion is a first oscillation wavelength. A bandgap wavelength of a barrier layer in the quantum well core layer in a second electric-field-absorption-type optical modulation portion having the quantum well core layer etched with the second mask is a second bandgap wavelength. An oscillation wavelength of the laser element portion from which laser light is applied to the second electric-field-absorption-type optical modulation portion is a second oscillation wavelength. An absolute value of a difference between the first bandgap wavelength and the first oscillation wavelength is a first wavelength difference. An absolute value of a difference between the second bandgap wavelength and the second oscillation wavelength is a second wavelength difference. The first width and the second width are set so as to keep a difference between the first wavelength difference and the second wavelength difference within a predetermined range.

Other and further objects, features and advantages of the invention will appear more fully from the following description.

DETAILED DESCRIPTION OF THE PREFERRED EMBODIMENTS

First Embodiment
<Construction of Device in First Embodiment>
(Construction of Optical Module)

Figure 1:
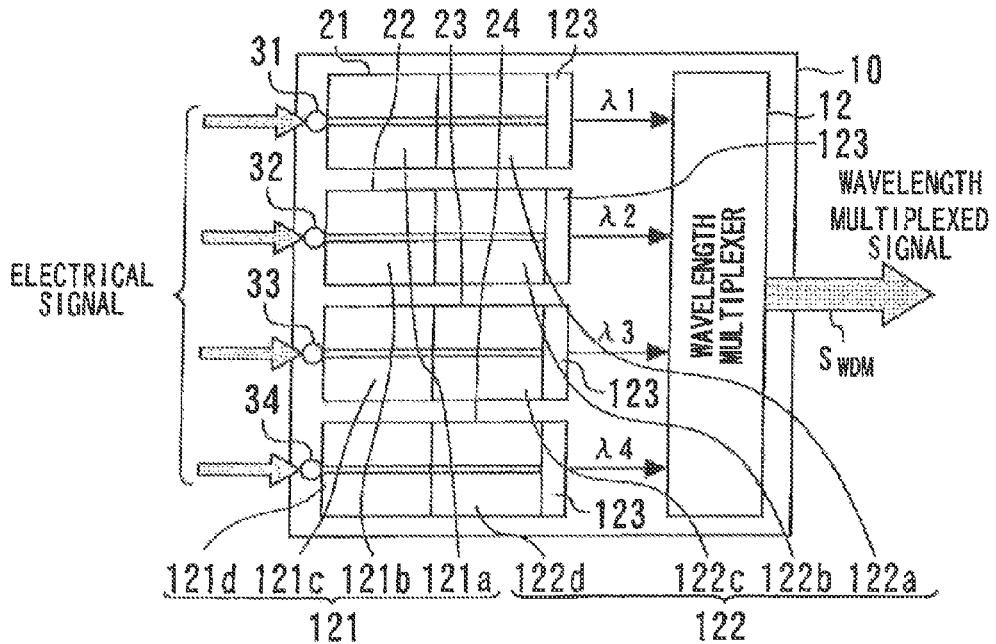
FIG. 1 is a diagram showing an optical module and a semiconductor optical element according a first embodiment of the present invention.

FIG. 1 is a block diagram showing an optical module 10 according a first embodiment of the present invention. The optical module 10 is a wavelength division multiplexing communication optical module used in a 100-Gbit/s optical communication system. The optical module 10 has in one package four integrated optical modulation elements 21 to 24 from which lights differing in wavelength emerge. The integrated optical modulation elements 21 to 24 are elements respectively formed on separate semiconductor substrates.

The integrated optical modulation element 21 has a signal input terminal 31, a laser element portion 121a and an electro-absorption modulator (EAM) portion 122a. EAM denotes an electric field absorption type of optical modulator. Similarly, the integrated optical modulation elements 22, 23, and 24 respectively have signal input terminals 32, 33, and 34, laser element portions 121b, 121c, and 121d and EAM portions 122b, 122c, and 122d. The laser element portions 121a, 121b, 121c, and 121d are also referred to collectively as laser element portions 121, and the EAM portions 122a, 122b, 122c, and 122d are also referred to collectively as EAM portions 122.

The optical module 10 has a wavelength multiplexer 12. The wavelength multiplexer 12 multiplexes lights respectively emerging from the EAM portions 122a, 122b, 122c, and 122d of the plurality of integrated optical modulation elements 21 to 24 and outputs the multiplexed light. The multiplexed light output from the wavelength multiplexer 12 is transmitted as a wavelength multiplexed signal $S_{WDM}$ through an optical waveguide such as an optical fiber.

Figure 2:
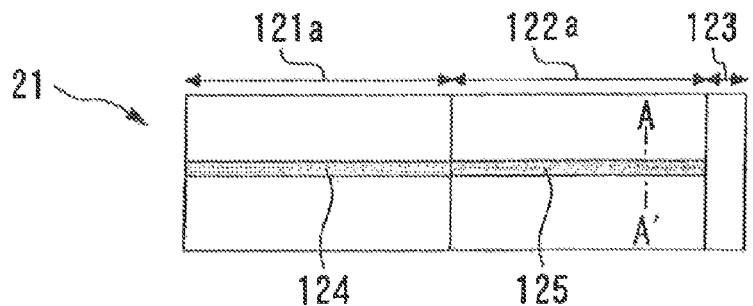
FIG. 2 is a diagram showing a semiconductor optical element according the first embodiment of the present invention.

FIG. 2 is a top view of the integrated optical modulation element 21 incorporated in the optical module 10. The integrated optical modulation element 21 has the laser element portion 121a and the EAM portion 122a integrally formed on one semiconductor substrate and a window structure 123 in its end surface. The laser element portion 121a has a waveguide 124. The EAM portion 122a has a waveguide 125.

Figure 3:
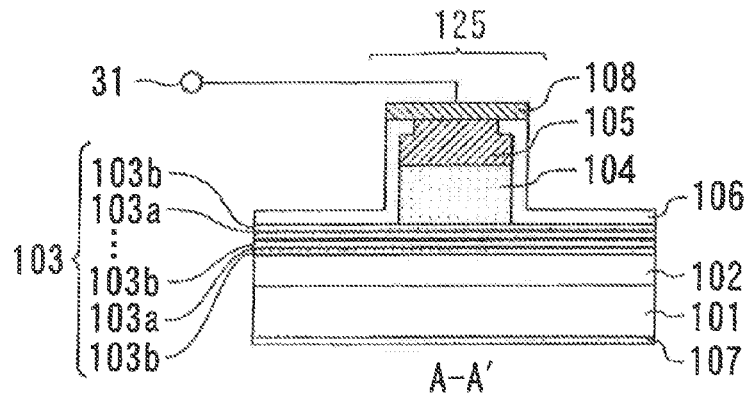
FIG. 3 is a diagram showing a semiconductor optical element according the first embodiment of the present invention.

FIG. 3 is a sectional view of the EAM portion 122a taken along line A-A' in FIG. 2. The EAM portion 122a has on an n-type InP substrate 101 an n-type InP cladding layer 102, an i-type InGaAsP quantum well core layer 103, a p-type InP cladding layer 104 and a p-type InGaAs contact layer 105 laid one on another. The multi-quantum-well core layer will hereinafter be referred to as "MQW core layer" for simplicity. The MQW core layer 103 has well layers 103a and barrier layers 103b alternately laid one on another. These layers may be such that, for example, the number of well layers 103a is 5 to 15; the thickness of the well layers 103a is 5 to 15 nm; and the thickness of the barrier layers 103b is 3 to 12 nm. Such design values of the well layers 103a and the barrier layers 103b are set uniform among the plurality of MQW core layers 103 in one optical module 10.

The i-type InGaAsP MQW core layer 103 receives laser light from the laser element portion 121a. The light absorption coefficient of the i-type InGaAsP MQW core layer 103 is controlled according to an electrical signal from the signal input terminal 31. Optical modulation can therefore be performed in the EAM portion 122a. The barrier layer thickness in the i-type InGaAsP MQW core layer 103 is within a range from 3 nm to 12 nm.

The p-type InP cladding layer 104 is formed as a ridge portion by etching two side portions thereof. An insulating film 106 covers the upper surface of the multilayer structure formed of the above-described layers. An n-side electrode 107 is formed on a lower surface of the n-type InP substrate 101. A p-side electrode 108 is formed on an upper surface of the p-type InGaAs contact layer 105.

The waveguide 125 shown in FIG. 2 is the ridge portion (which is the structure above the p-type InP cladding layer 104) described above with reference to FIG. 3.

In the laser element portion 121a whose structure as seen in section is not illustrated, a semiconductor laser element with a ridge portion is formed like the EAM portion 122a whose structure as seen in section is illustrated in FIG. 3. An n-type InP cladding layer 102 is formed on an n-type InP substrate 101 like that in the EAM portion 122a. A quaternary mixed crystal i-type MQW core layer and a p-type InP cladding layer are laid on the n-type InP cladding layer 102. In the p-type InP cladding layer, a diffraction grating layer 133a of a quaternary mixed crystal is provided. Any of well-known semiconductor layer device structures may be applied to the laser element portion 121a. Therefore, no detailed description will be made of the laser element portion 121a.

Various structures corresponding to the structure of integrated optical modulation elements including the one in the first embodiment having a laser element portion and an EAM portion (i.e., an electric-field-absorption-type optical modulator portion) integral with each other and various techniques suitable for manufacturing the integrated optical modulation element are well known and are not novel matters. Therefore, no further detailed description will be made of the integrated optical modulation element.

The integrated optical modulation elements 22, 23, and 24 have laser element portions 121b, 121c, and 121d and EAM portions 122b, 122c, and 122d, as does the integrated optical modulation element 21. In the integrated optical modulation elements 21 to 24 however, the semiconductor materials of the active layers in the laser element portions 121a to 121d and the MQW core layers in the EAM portions 122a to 122d are made different in composition ratio from each other. This is for the purpose of making different from each other the oscillation wavelengths of the laser element portions and the barrier layer bandgap wavelengths and the photoluminescence wavelengths of the EAM portions among the integrated optical modulation elements 21 to 24.

Techniques for designing the structures of the active layers in the laser element portions and the MQW core layers in the EAM portions in order to obtain the desired oscillation wavelengths, barrier layer bandgap wavelengths and photoluminescence wavelengths belong to well-known techniques. Therefore, the designing techniques will not be described in this specification.

(Parameters for Device in First Embodiment)

Design parameters for the integrated optical modulation elements 21 to 24 in the optical module 10 according to the first embodiment will be described. The inventors of the present invention took design parameters shown below into consideration and found that extinction ratio variation among the integrated optical modulation elements 21 to 24 can be reduced.

Oscillation wavelength $\lambda_{LD}$
Barrier layer bandgap wavelength $\lambda_{BG}$
MQW core layer photoluminescence (PL) wavelength $\lambda_{PL}$
LDBG wavelength difference $\Delta\lambda_{LDBG}$
LDPL wavelength difference $\Delta\lambda_{LDPL}$ (1) Oscillation Wavelength $\lambda_{LD}$ Oscillation wavelength $\lambda_{LD}$ will first be described. Oscillation wavelength $\lambda_{LD}$ is a design parameter for the laser element portions 121a to 121d of the respective integrated optical modulation elements 21 to 24. The oscillation wavelength of the laser element portion 121a is $\lambda_{LD}1$. The oscillation wavelength of the laser element portion 121b is $\lambda_{LD}2$. The oscillation wavelength of the laser element portion 121c is $\lambda_{LD}3$. The oscillation wavelength of the laser element portion 121d is $\lambda_{LD}4$.

More specifically, in the case where the materials and the structures according to the present embodiment are used, the oscillation wavelengths $\lambda_{LD}1$, $\lambda_{LD}2$, $\lambda_{LD}3$ and $\lambda_{LD}4$ are as shown below. $\lambda_{LD}1$ is 1294.53 to 1296.59 nm; $\lambda_{LD}2$, 1299.02 to 1301.09 nm; $\lambda_{LD}3$, 1303.54 to 1305.63 nm; and $\lambda_{LD}4$, 1308.09 to 1310.19 nm. These values satisfy the IEEE802.3ba standard.

In the first embodiment, values used in the calculation of equation (1) and other subsequent equations shown below are medians of the ranges of $\lambda_{LD}1$ to $\lambda_{LD}4$ shown above. That is, $\lambda_{LD}1$ to be used in the calculation is 1295.56 nm. $\lambda_{LD}2$ to be used in the calculation is 1300.055 nm. $\lambda_{LD}3$ to be used in the calculation is 1304.585 nm. $\lambda_{LD}4$ to be used in the calculation is 1309.14 nm. In the first embodiment, a magnitude relationship: $\lambda_{LD}1<\lambda_{LD}2<\lambda_{LD}3<\lambda_{LD}4$ is established.

Thus, in the optical module 10 according to the first embodiment, the oscillation wavelengths $\lambda_{LD}$ of the laser element portions 121a to 121d are in a 1.3 µm band. "1.3 µm band" denotes a range from 1250 to 1350 nm, and "1.1 µm band" denotes a range from 1000 to 1120 nm.

(2) Barrier Layer Bandgap Wavelength $\lambda_{BG}$

Barrier layer bandgap wavelength $\lambda_{BG}$ will next be described. Barrier layer bandgap wavelength $\lambda_{BG}$ is a design parameter for the EAM portions 122a to 122d.

In the integrated optical modulation element 21, the EAM portion 122a has the i-type InGaAsP MQW core layer 103. In general, a MQW layer (i.e., a multi-quantum-well core layer) includes barrier layers. The i-type InGaAsP MQW core layer 103 also includes barrier layers. The bandgap wavelength of these barrier layers is $\lambda_{BG}1$.

Similarly, the bandgap wavelength of the barrier layers in the EAM portion 122b of the integrated optical modulation element 22 is $\lambda_{BG}2$. The bandgap wavelength of the barrier layers in the EAM portion 122c of the integrated optical modulation element 23 is $\lambda_{BG}3$. The bandgap wavelength of the barrier layers in the EAM portion 122d of the integrated optical modulation element 24 is $\lambda_{BG}4$.

In the first embodiment, $\lambda_{BG}1$ is set to 1080 nm; $\lambda_{BG}2$ to 1084.5 nm; $\lambda_{BG}3$ to 1089 nm; and $\lambda_{BG}4$ to 1093.5 nm. In the first embodiment, a magnitude relationship: $\lambda_{BG}1<\lambda_{BG}2<\lambda_{BG}3<\lambda_{BG}4$ is established.

Thus, in the optical module 10 according to the first embodiment, the bandgap wavelengths $\lambda_{BG}1$ to $\lambda_{BG}4$ of the barrier layers in the EAM portions 122a to 122d are in the 1.1 µm band.

(3) Photoluminescence (PL) Wavelength $\lambda_{PL}$ of MQW Core Layer

Photoluminescence (PL) wavelength $\lambda_{PL}$ will be described. Photoluminescence (PL) wavelength $\lambda_{PL}$ is another design parameter for the EAM portions 122a to 122d. The photoluminescence wavelength of the i-type InGaAsP MQW core layer 103 in the EAM portion 122a is $\lambda_{PL}1$.

Similarly, the photoluminescence wavelength of the MQW core layer in the EAM portion 122b is $\lambda_{PL}2$. The photoluminescence wavelength of the MQW core layer in the EAM portion 122c is $\lambda_{PL}3$. The photoluminescence wavelength of the MQW core layer in the EAM portion 122d is $\lambda_{PL}4$.

(4) LDBG Wavelength Difference $\Delta\lambda_{LDBG}$

LDBG wavelength difference $\Delta\lambda_{LDBG}$ will be described. LDBG wavelength difference $\Delta\lambda_{LDBG}$ is a design parameter in terms of the difference between the laser element portions 121a to 121d and the EAM portions 122a to 122d in the integrated optical modulation elements 21 to 24.

LDBG wavelength difference $\Delta\lambda_{LDBG}$ is the absolute value of the difference between the oscillation wavelength $\lambda_{LD}$ and the barrier layer bandgap wavelength $\lambda_{BG}$ in each of the integrated optical modulation elements 21 to 24. That is, $\Delta\lambda_{LDBG}1$, which is a design parameter for the integrated optical modulation element 21, is the absolute value of the difference between $\lambda_{LD}1$ and $\lambda_{BG}1$ obtained by the following equation (1):

$$\Delta\lambda_{LDBG}1=|\lambda_{LD}1-\lambda_{BG}1| \quad (1)$$

Similarly, $\Delta\lambda_{LDBG}2$, which is a design parameter for the integrated optical modulation element 22, $\Delta\lambda_{LDBG}3$, which is a design parameter for the integrated optical modulation element 23 and $\Delta\lambda_{LDBG}4$, which is a design parameter for the integrated optical modulation element 24, are obtained by the following equations (2) to (4):

$$\Delta\lambda_{LDBG}2=|\lambda_{LD}2-\lambda_{BG}2| \quad (2)$$

$$\Delta\lambda_{LDBG}3=|\lambda_{LD}3-\lambda_{BG}3| \quad (3)$$

$$\Delta\lambda_{LDBG}4=|\lambda_{LD}4-\lambda_{BG}4| \quad (4)$$

In the first embodiment, variation among $\Delta\lambda_{LDBG}1$, $\Delta\lambda_{LDBG}2$, $\Delta\lambda_{LDBG}3$ and $\Delta\lambda_{LDBG}4$ is limited within a predetermined range. In the first embodiment, a range from (a target value−1 nm) to (the target value+1 nm) is set as this predetermined range. Thus, in the first embodiment, $\lambda_{LD}1$ to $\lambda_{LD}4$ and $\lambda_{BG}1$ to $\lambda_{BG}4$ are set so that the difference between the largest and smallest values in $\Delta\lambda_{LDBG}1$ to $\Delta\lambda_{LDBG}4$ is not larger than 2 nm.

More specifically, in the first embodiment, $\lambda_{LD}1$ to $\lambda_{LD}4$ and $\lambda_{BG}1$ to $\lambda_{BG}4$ are set so that $\Delta\lambda_{LDBG}1$ to $\Delta\lambda_{LDBG}4$ fall within a range of 216±1 nm. The value 216 nm is the target value in this case. This condition is shown by the following expression:

$$215 \text{ nm} \leq \Delta\lambda_{LDBG}1 \text{ to } \Delta\lambda_{LDBG}4 \leq 217 \text{ nm} \quad (5)$$

(5) LDPL Wavelength Difference $\Delta\lambda_{LDPL}$

LDPL wavelength difference $\Delta\lambda_{LDPL}$ will be described. LDPL wavelength difference $\Delta\lambda_{LDPL}$ is another design parameter in terms of the difference between the laser element portions 121a to 121d and the EAM portions 122a to 122d.

LDPL wavelength difference $\Delta\lambda_{LDPL}$ is the absolute value of the difference between one of the oscillation wavelengths $\lambda_{LD}1$ to $\lambda_{LD}4$ and one of the photoluminescence wavelengths $\lambda_{PL}1$ to $\lambda_{PL}4$ corresponding to each other. That is, $\Delta\lambda_{LDPL}1$, which is a design parameter for the integrated optical modulation element 21, is the absolute value of the difference between $\lambda_{LD}1$ and $\lambda_{PL}1$ obtained by the following equation (6):

$$\Delta\lambda_{LDPL}1 = |\lambda_{LD}1 - \lambda_{PL}1| \quad (6)$$

Similarly, $\Delta\lambda_{LDPL}2$, which is a design parameter for the integrated optical modulation element 22, $\Delta\lambda_{LDPL}3$, which is a design parameter for the integrated optical modulation element 23 and $\Delta\lambda_{LDPL}4$, which is a design parameter for the integrated optical modulation element 24, are obtained by the following equations (7) to (9):

$$\Delta\lambda_{LDPL}2 = |\lambda_{LD}2 - \lambda_{PL}2| \quad (7)$$

$$\Delta\lambda_{LDPL}3 = |\lambda_{LD}3 - \lambda_{PL}3| \quad (8)$$

$$\Delta\lambda_{LDPL}4 = |\lambda_{LD}4 - \lambda_{PL}4| \quad (9)$$

In the first embodiment, variation among $\Delta\lambda_{LDPL}1$, $\Delta\lambda_{LDPL}2$, $\Delta\lambda_{LDPL}3$ and $\Delta\lambda_{LDPL}4$ is limited within a predetermined range. In the first embodiment, a range from (a target value−1 nm) to (the target value+1 nm) is set as this predetermined range. Thus, in the first embodiment, $\lambda_{LD}1$ to $\lambda_{LD}4$ and $\lambda_{PL}1$ to $\lambda_{PL}4$ are set so that the difference between the largest and smallest values in $\Delta\lambda_{LDPL}1$ to $\Delta\lambda_{LDPL}4$ is not larger than 2 nm.

<Operation and Effects of Device in First Embodiment>

The optical module 10 according to the first embodiment is designed by setting the oscillation wavelengths $\lambda_{LD}1$ to $\lambda_{LD}4$ and the barrier layer bandgap wavelengths $\lambda_{BG}1$ to $\lambda_{BG}4$ so as to satisfy expression (5) shown above. That is, when there are differences $\Delta\lambda_{LDBG}$ between the barrier layer bandgap wavelengths $\lambda_{BG}$ and the oscillation wavelengths $\lambda_{LD}$, the magnitude of variation of $\Delta\lambda_{LDBG}1$, $\Delta\lambda_{LDBG}2$, $\Delta\lambda_{LDBG}3$ and $\Delta\lambda_{LDBG}4$ that the integrated optical modulation elements 21 to 24 have falls within the range from −1 nm to +1 nm.

This design enables uniformization of the amounts of laser light absorption in the integrated optical modulation elements 21 to 24 whose oscillation wavelengths differ from each other, such that extinction ratio variation among the integrated optical modulation elements 21 to 24 falls within a range from −0.1 dB to +0.1 dB. Enabling inhibition of variation of the extinction ratio means enabling inhibition of optical output variation. Limiting extinction ratio variation to 0.1 dB or less is one of performance capabilities required of a practical optical module.

The integrated optical modulation elements 21 to 24 can also be made uniform in modulation characteristics. Advantageously, an improvement in controllability of the optical module 10 can be achieved with this uniformization.

The reason that the above-described effect can be obtained will be described below.

The EA modulator is a type of optical modulator using the quantum-confined Stark effect and having the light absorption coefficient controlled by applying an electric field to the MQW core layer. If the barrier layer bandgap wavelength $\lambda_{BG}$ is reduced causing increases in depth of the quantum wells, confinement of electrons and holes becomes stronger, making binding of excitons stronger. Excitons then become not easily breakable at the time of application of an electric field, so that the absorption coefficient changes more steeply. The quantum well depth is one of important characteristics for extinction ratio control.

Figure 4A:
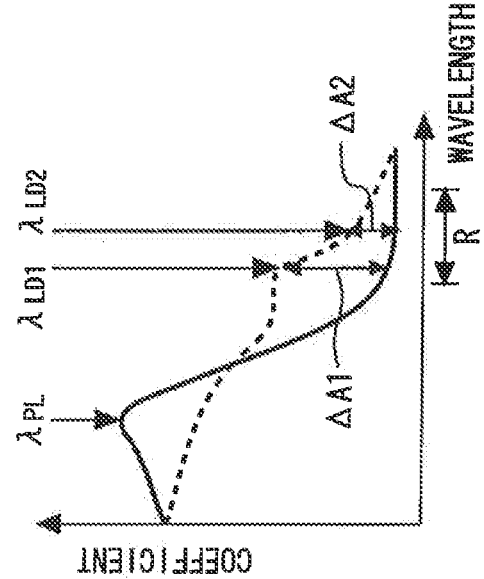
FIGS. 4A to 4C are diagrams illustrating operations of an optical module and a semiconductor optical element according the first embodiment of the present invention.
Figure 4B:
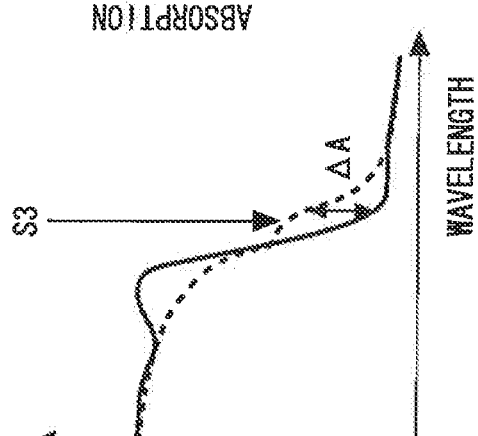
Figure 4C:
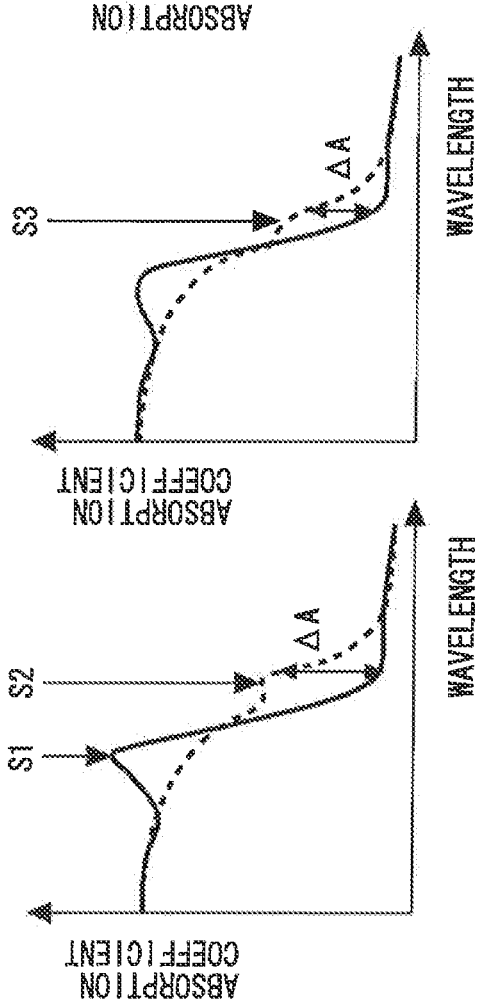

Each of FIGS. 4A to 4C schematically shows a state where the light absorption coefficient of the MQW core layer is changed by application of an electric field. In each of FIGS. 4A to 4C, the solid line indicates a characteristic when no electric field is applied to the EAM portion 122a, and the broken line indicates a characteristic when the electric field is applied to the EAM portion 122a.

FIGS. 4A and 4B show wavelength characteristics of the light absorption coefficients of two EA modulators differing in quantum well depth from each other. FIG. 4A designates a case where the quantum wells are deeper and excitons are not easily breakable even at the time of application of the electric field. FIG. 4B designates a case where the quantum wells are shallower and excitons are easily breakable at the time of application of the electric field in comparison with the case designated by FIG. 4A.

Referring to FIG. 4A, an exciton peak shift from peak S1 to peak S2 is caused by the application of the electric field. Referring to FIG. 4B, an exciton peak is reduced by the electric field (see peak S3).

The extinction ratio is determined by the amount of change $\Delta A$ in the light absorption coefficient. A comparison between FIGS. 4A and 4B indicates that the amount of change $\Delta A$ in FIG. 4A is larger than $\Delta A$ in FIG. 4B. Thus, a higher extinction ratio can be obtained in the case designated by FIG. 4A, where the quantum wells are deeper and a substantial exciton peak remains even when the electric field is applied.

The difference between the oscillation wavelength $\lambda_{LD}$ and the photoluminescence (PL) wavelength $\lambda_{PL}$ largely influences the extinction ratio. For example, in the integrated optical modulation element 21, the difference between the oscillation wavelength $\lambda_{LD}1$ and the photoluminescence (PL) wavelength $\lambda_{PL}1$ largely influences the extinction ratio.

As shown in FIG. 4C, when $\Delta\lambda_{LDPL}2$ is larger than $\Delta\lambda_{LDPL}1$, the amount of change $\Delta A2$ in the amounts of change $\Delta A1$ and $\Delta A2$ in the light absorption coefficient respectively corresponding to $\lambda_{LD}1$ and $\lambda_{LD}2$ is smaller than the amount of change $\Delta A1$. That is, when the oscillation wavelength is changed from $\lambda_{LD}1$ to $\lambda_{LD}2$, the extinction ratio is reduced from $\Delta A1$ to $\Delta A2$.

A wavelength range to be used in the actual EA modulator is indicated as an actually usable range R for actual use in FIG. 4C. In the actually usable range R, the light absorption coefficient at the time of electric field application tends to be smaller when $\Delta\lambda_{LDPL}$ is increased. In the actually usable range R, in accordance with this tendency, the extinction ratio becomes lower with increase in $\Delta\lambda_{LDPL}$.

It has been thought that the quantum well depth has no significant influence on the extinction ratio in a wavelength range such as one used in wavelength division multiplexing communication. Correspondingly, no idea of controlling the quantum well depth as a design parameter for each of a plurality of integrated optical modulation elements provided in an optical module similar to the optical module 10 according to the first embodiment has been conceived.

The inventors of the present invention took the difference between the oscillation wavelength $\lambda_{LD}$ of the laser and the barrier layer bandgap wavelength $\lambda_{BG}$ into consideration and found that this difference largely influences the extinction ratio.

Figure 5A:
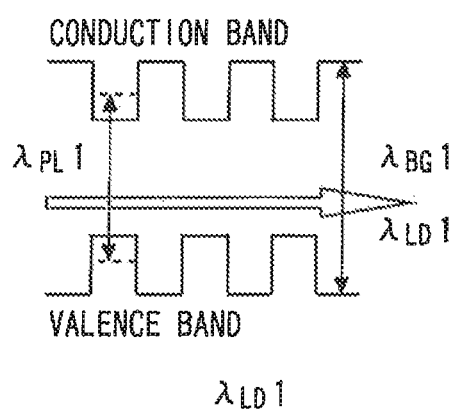
FIGS. 5A and 5B are diagrams illustrating operations of an optical module and a semiconductor optical element according the first embodiment of the present invention.
Figure 5B:
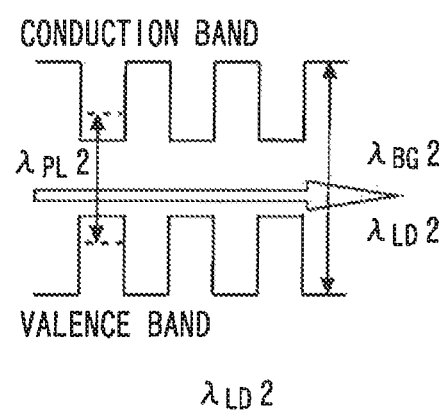

FIG. 5A is a schematic diagram of the band structure of the i-type InGaAsP MQW core layer 103 in the EAM portion 122a. FIG. 5B is a schematic diagram of the band structure of the MQW core layer (not shown) in the EAM portion 122b. As parameters having a large influence on the extinction ratio, $\Delta\lambda_{LDPL}$ and $\Delta\lambda_{LDBG}$ exist.

It is assumed here that three equations shown below are established.

$$\lambda_{BG}1 = \lambda_{BG}2 \qquad (10)$$

$$\Delta\lambda_{LDPL}1 = \Delta\lambda_{LDPL}2 \qquad (11)$$

$$\Delta\lambda_{LDBG}1 - \Delta\lambda_{LDBG}2 = \lambda_{LD}1 - \Delta\lambda_{LD}2 \qquad (12)$$

For consideration of the influence of $\Delta\lambda_{LDBG}$ on the extinction ratio between two integrated optical modulation elements, it is assumed here that $\Delta\lambda_{LDPL}1$ in the integrated optical modulation element 21 and $\Delta\lambda_{LDPL}2$ in the integrated optical modulation element 22 are equal to each other. This is expressed by the above equation (11). It is also assumed that the bandgap wavelengths $\lambda_{BG}1$ and $\lambda_{BG}2$ are equal to each other, that is, equation (10) is established. In this case, the difference between $\Delta\lambda_{LDBG}1$ and $\Delta\lambda_{LDBG}2$ is equal to the difference between the oscillation wavelengths $\lambda_{LD}1$ and $\lambda_{LD}2$, as shown by equation (12).

A comparison between FIG. 5A and FIG. 5B indicates that the quantum wells in the integrated optical modulation element 21 having the shorter oscillation wavelength are shallower than those in the integrated optical modulation element 22. If the quantum wells are shallower, confinement of electrons and holes becomes weaker and the extinction ratio is reduced.

There is a correlation between the difference between the oscillation wavelengths $\lambda_{LD}1$ and $\lambda_{LD}2$ and the difference between the extinction ratios of the integrated optical modulation elements 21 and 22. Accordingly, a comparison between the two integrated optical modulation elements 21 and 22 indicates that if the difference between the oscillation wavelengths of the integrated optical modulation elements 21 and 22 is increased, there is a tendency of the difference in quantum well depth between the integrated optical modulation elements 21 and 22 and the difference in extinction ratio between the integrated optical modulation elements 21 and 22 to become larger. Conversely, if the difference between the oscillation wavelengths of the integrated optical modulation elements 21 and 22 is reduced, there is a tendency of the difference in quantum well depth between the integrated optical modulation elements 21 and 22 and the difference in extinction ratio between the integrated optical modulation elements 21 and 22 to become smaller.

The inventors of the present invention hit upon a new idea of utilizing such a tendency and invented a novel semiconductor optical element and optical module in which extinction ratio variation was inhibited.

The oscillation wavelengths $\lambda_{LD}1$ to $\lambda_{LD}4$ of the laser element portions 121a to 121d are different from each other. In the first embodiment, for the laser element portion having a larger one of the oscillation wavelengths $\lambda_{LD}1$ to $\lambda_{LD}4$ of the laser element portions 121a to 121d, the barrier layer bandgap wavelength of the EAM portion is set larger. That is, if $\lambda_{LD}2$ is larger than $\lambda_{LD}1$, $\lambda_{BG}2$ is set larger than $\lambda_{BG}1$. If $\lambda_{LD}4$ is larger than $\lambda_{LD}3$, $\lambda_{BG}4$ is set larger than $\lambda_{BG}3$.

In summary, in the first embodiment, since the relationship: $\lambda_{LD}1 < \lambda_{LD}2 < \lambda_{LD}3 < \lambda_{LD}4$ is established, the values of the barrier layer bandgap wavelengths are correspondingly set in accordance with a tendency of $\lambda_{BG}1 < \lambda_{BG}2 < \lambda_{BG}3 < \lambda_{BG}4$. The setting of the concrete numeric values of $\lambda_{LD}1$ to $\lambda_{LD}4$ and $\lambda_{BG}1$ to $\lambda_{BG}4$ in the first embodiment described above also accords with this tendency.

In this way, the magnitudes of the barrier layer bandgap wavelengths $\lambda_{BG}1$ to $\lambda_{BG}4$ can be suitably changed in accordance with the tendency of the oscillation wavelengths that the laser element portions 121a to 121d have. As a result, excessive increase in difference between the oscillation wavelengths and the barrier layer bandgap wavelengths can be inhibited and excessive increase in extinction ratio variation can be inhibited.

It is desirable in practice to limit extinction ratio variation among the integrated optical modulation elements 21 to 24 to 0.1 dB or less. The inventors of the present invention therefore carried out an experiment and computation on the influence of $\Delta\lambda_{LDBG}$ on the extinction ratio in the optical module 10 according to the first embodiment.

The conditions under which the experiment was made were that the calculated $\lambda_{LD}1$ to $\lambda_{LD}4$ were in the 1.3 μm band, the calculated $\lambda_{BG}1$ to $\lambda_{BG}4$ were in the 1.1 μm band and the calculated barrier layer thickness of the i-type InGaAsP MQW core layer 103 was 3 to 12 nm. The results of the experiment show that limiting the magnitude of variation of $\Delta\lambda_{LDBG}$ within the range from −1 nm to +1 nm suffices for limiting extinction ratio variation to 0.1 dB or less.

The inventors of the present invention therefore carried out an experiment and computation on the influence of $\Delta\lambda_{LDPL}$ on the extinction ratio in the optical module 10 according to the first embodiment. The conditions under which this experiment was made were that the calculated $\Delta\lambda_{LDPL}1$ to $\Delta\lambda_{LDPL}4$ each fall within a range from 40 nm to 90 nm at room temperature. The results of the experiment show that limiting the magnitude of variation of $\Delta\lambda_{LDPL}1$ to $\Delta\lambda_{LDPL}4$ within the range from −1 nm to +1 nm suffices for limiting extinction ratio variation to 0.1 dB or less.

The value of $\Delta\lambda_{LDBG}$ and the value of $\Delta\lambda_{LDPL}$ independently influence the extinction ratio. In designing a practical optical module, it is preferable to limit each of the magnitude of variation of $\Delta\lambda_{LDBG}1$ to $\Delta\lambda_{LDBG}4$ and the magnitude of variation of $\Delta\lambda_{LDPL}1$ to $\lambda_{LDPL}4$ within the range from −1 nm to +1 nm.

The optical module 10 according to the first embodiment has the EAM portion 122 with the ridge-type waveguide 125. However, the present invention is not limited to this. An EAM portion having a buried or high-mesa-type waveguide may alternatively be provided.

In the first embodiment, each of the MQW core layers in the EAM portions 122a to 122d is an i-type InGaAsP MQW layer. However, the present invention is not limited to this. A tertiary or quaternary mixed crystal i-type quantum well core layer may alternatively be used. Each of the MQW core layers in the EAM portions 122a to 122d may be formed of AlGaInAs, InGaAs or AlInAs instead of InGaAsP.

The optical module 10 according to the first embodiment has four integrated optical modulation elements 21 to 24. However, the present invention is not limited to this. The present invention can be applied to an optical module having two or more integrated optical modulation elements.

The window structure 123 is not necessarily provided on the light emergence end surface of each of the EAM portions 122a to 122d. Each of the four integrated optical modulation elements 21 to 24 may have a passive waveguide at its light emergence end surface or in its central portion for example.

In the first embodiment, the magnitude of variation of $\Delta\lambda_{LDBG}$ among the integrated optical modulation elements 21 to 24 is limited within the range from −1 nm to +1 nm. However, the present invention is not limited to this. The magnitude of variation of $\Delta\lambda_{LDBG}$ may be limited within the range from −1 nm to +1 nm only between arbitrarily selected two of the integrated optical modulation elements.

For example, the difference in $\Delta\lambda_{LDBG}$ between the integrated optical modulation element on the shortest-wavelength side and the integrated optical modulation element on the longest-wavelength side only may be limited within the range from −1 nm to +1 nm. The difference in extinction ratio between the selected two integrated optical modulation elements can be reduced thereby.

It has been described with respect to the first embodiment that it is preferable to limit the magnitude of variation among $\Delta\lambda_{LDBG}1$ to $\Delta\lambda_{LDBG}4$ within the predetermined range from −1 nm to +1 nm, that is, it is preferable to set $\lambda_{LD}1$ to $\lambda_{LD}4$ and $\lambda_{BG}1$ to $\lambda_{BG}4$ so that the difference between the largest and smallest values in $\lambda_{LDBG}1$ to $\Delta\lambda_{LDBG}4$ is not larger than 2 nm. It has also been described with respect to the first embodiment that it is preferable to limit the magnitude of variation among $\Delta\lambda_{LDPL}1$ to $\Delta\lambda_{LDPL}4$ within the predetermined range from −1 nm to +1 nm. However, the present invention is not limited to this.

In a first modified example, the magnitude of variation among $\Delta\lambda_{LDBG}1$ to $\Delta\lambda_{LDBG}4$ may be limited within a predetermined range from −3 nm to +3 nm. That is, $\lambda_{LD}1$ to $\lambda_{LD}4$ and $\lambda_{BG}1$ to $\lambda_{BG}4$ may be set so that the difference between the largest and smallest values in $\Delta\lambda_{LDBG}1$ to $\Delta\lambda_{LDBG}4$ is not larger than 6 nm.

Also, the magnitude of variation among $\Delta\lambda_{LDPL}1$ to $\Delta\lambda_{LDPL}4$ may be limited within a predetermined range from −3 nm to +3 nm. That is, $\lambda_{LD}1$ to $\lambda_{LD}4$ and $\lambda_{PL}1$ to $\lambda_{PL}4$ may be set so that the difference between the largest and smallest values in $\Delta\lambda_{LDPL}1$ to $\Delta\lambda_{LDPL}4$ is not larger than 6 nm.

By setting such predetermined ranges, extinction ratio variation can be limited to about ±0.3 dB. The effect of enabling the MQW structures in each adjacent pair of the EAM portions 122a to 122d to be unified is also obtained. Advantageously, enabling the provision of the same MQW structure in the plurality of EAM portions means that the number of times butt joints are made to manufacture the EAM portions in a manufacturing process in which monolithic integration is performed can be reduced.

In a second modified example, the magnitude of variation among $\Delta\lambda_{LDBG}1$ to $\Delta\lambda_{LDBG}4$ may be limited within a predetermined range from −5 nm to +5 nm. That is, $\lambda_{LD}1$ to $\lambda_{LD}4$ and $\lambda_{BG}1$ to $\lambda_{BG}4$ may be set so that the difference between the largest and smallest values in $\Delta\lambda_{LDBG}1$ to $\Delta\lambda_{LDBG}4$ is not larger than 10 nm.

The magnitude of variation among $\Delta\lambda_{LDPL}1$ to $\Delta\lambda_{LDPL}4$ may alternatively be limited within a predetermined range from −5 nm to +5 nm. That is, $\lambda_{LD}1$ to $\lambda_{LD}4$ and $\lambda_{PL}1$ to $\lambda_{PL}4$ may be set so that the difference between the largest and smallest values in $\Delta\lambda_{LDPL}1$ l to $\Delta\lambda_{LDPL}4$ is not larger than 10 nm Setting such predetermined ranges enables realization of equivalent characteristics with respect to different wavelengths by adjusting EAM drive conditions.

Second Embodiment

<Construction of Device in Second Embodiment>

Figure 6:
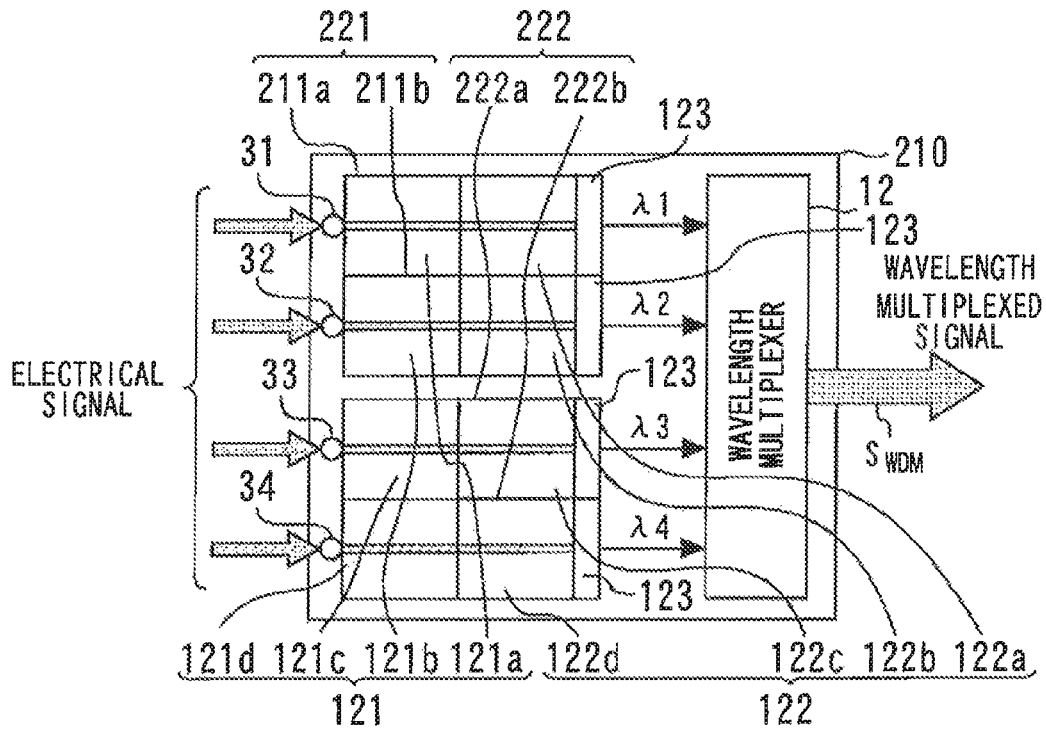
FIG. 6 is a diagram showing an optical module and a semiconductor optical element according a second embodiment of the present invention.

FIG. 6 is a block diagram of an optical module 210 according to a second embodiment of the present invention. The optical module 210 is a wavelength division multiplexing communication optical module used in a 100-Gbit/s optical communication system.

The optical module 210 has a monolithic optical element 221 and a monolithic optical element 222. The monolithic optical element 221 has two integrated optical modulation element portions 221a and 221b monolithically integrated on one semiconductor substrate. Similarly, the monolithic optical element 222 has two integrated optical modulation element portions 222a and 222b monolithically integrated on another semiconductor substrate.

The integrated optical modulation element portions 221a, 221b, 222a, and 222b seen as a single element respectively have the same constructions as those of the integrated optical modulation elements 21 to 24 according to the first embodiment.

That is, the integrated optical modulation element portion 221a seen as a single element has the same construction as that of the integrated optical modulation element 21. Accordingly, the integrated optical modulation element portion 221a has the oscillation wavelength $\lambda_{LD}1$, the barrier layer bandgap wavelength $\lambda_{BG}1$ and the photoluminescence wavelength $\lambda_{PL}1$, as does the integrated optical modulation element 21.

The integrated optical modulation element portion 221b seen as a single element has the same construction as that of the integrated optical modulation element 22. Accordingly, the integrated optical modulation element portion 221b has the oscillation wavelength $\lambda_{LD}2$, the barrier layer bandgap wavelength $\lambda_{BG}2$ and the photoluminescence wavelength $\lambda_{PL}2$, as does the integrated optical modulation element 22.

The integrated optical modulation element portion 222a seen as a single element has the same construction as that of the integrated optical modulation element 23. Accordingly, the integrated optical modulation element portion 222a has the oscillation wavelength $\lambda_{LD}3$, the barrier layer bandgap wavelength $\lambda_{BG}3$ and the photoluminescence wavelength $\lambda_{PL}3$, as does the integrated optical modulation element 23.

The integrated optical modulation element portion 222b seen as a single element has the same construction as that of the integrated optical modulation element 24. Accordingly, the integrated optical modulation element portion 222b has the oscillation wavelength $\lambda_{LD}4$, the barrier layer bandgap wavelength $\lambda_{BG}4$ and the photoluminescence wavelength $\lambda_{PL}4$, as does the integrated optical modulation element 24.

In the optical module 210, therefore, each of the magnitudes of variations of $\Delta\lambda_{LDPL}$ and $\Delta\lambda_{LDBG}$ is limited within a predetermined range, as is that in the optical module 10 according to the first embodiment. Also in the second embodiment, this predetermined range is a range from −1 nm to +1 nm.

Figure 7:
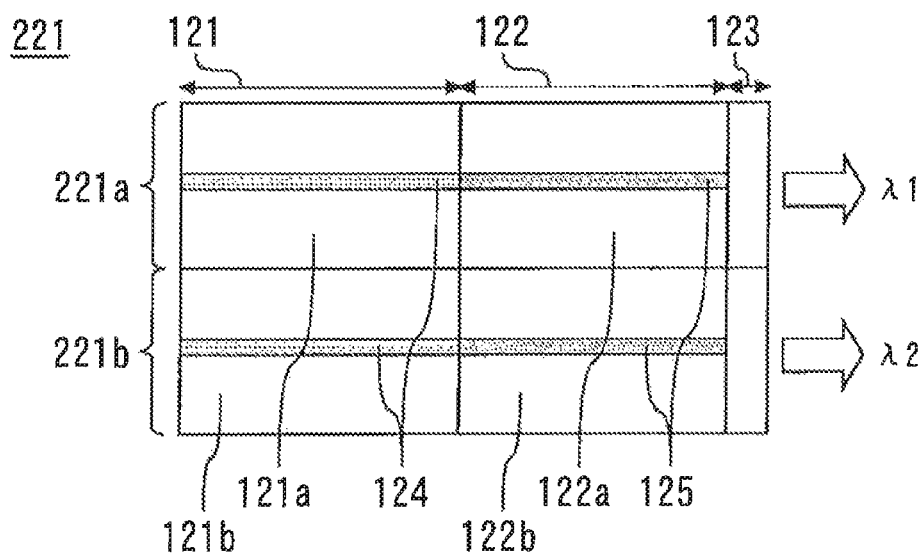
FIG. 7 is a diagram showing a semiconductor optical element according the second embodiment of the present invention.

FIG. 7 is a top view of the monolithic optical element 221. The monolithic optical element 221 has, in the integrated optical modulation element portions 221a and 221b, laser element portions 121a and 121b, EAM portions 122a and 122b, and window structures 123. The monolithic optical element 222 has, in the integrated optical modulation element portions 222a and 222b, laser element portions 121c and 121d, EAM portions 122c and 122d, and window structures 123. The laser element portions 121a to 121d each include waveguides 124. The EAM portions 122a to 122d each include waveguides 125.

In the optical module 210, two integrated optical element portions are provided as monolithic optical elements on one semiconductor substrate. Therefore, the optical module can be reduced in size compared with that in the first embodiment in which integrated optical element portions are formed on separate substrates.

<Manufacturing Method According to Second Embodiment>

FIGS. 8 to 12 are diagrams showing a process of manufacturing the optical module 210 according to the second embodiment of the present invention. FIG. 13 is a flowchart showing a method of manufacturing the optical module 210 according to the second embodiment of the present invention.

The manufacturing method according to the second embodiment enables growing MQW core layers having different barrier layer bandgap wavelengths on one semiconductor substrate. The manufacturing method according to the second embodiment enables easy adjustment of the oscillation wavelengths, the barrier layer bandgap wavelengths and the photoluminescence wavelengths described in the description of the first embodiment.

(Step S201)

Figure 8:
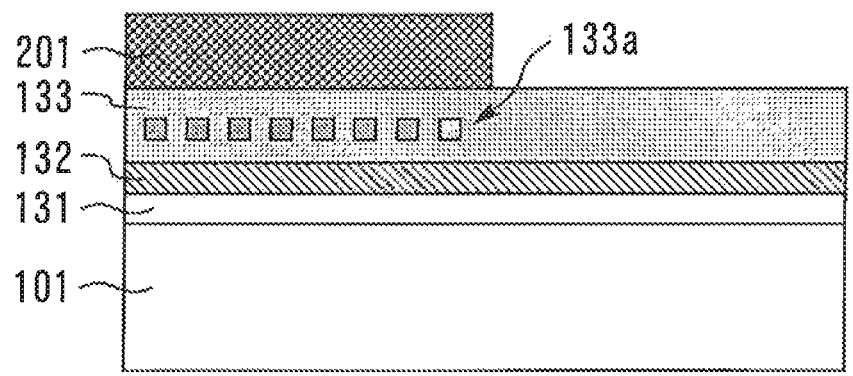
FIG. 8 is a diagram showing a process of manufacturing a semiconductor optical element and an optical module according to the second embodiment of the present invention.

First, as shown in FIG. 8, an n-type InP cladding layer 131, a quaternary mixed crystal i-type MQW core layer 132 and a p-type InP cladding layer 133 are grown on the n-type InP substrate 101 by metal organic chemical vapor deposition (MOCVD). A quaternary mixed crystal diffraction grating layer 133a is provided in the p-type InP cladding layer 133.

(Step S202)

Figure 9:
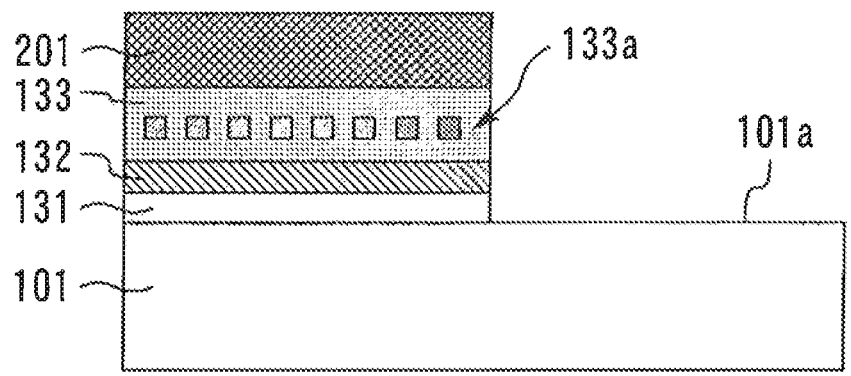
FIG. 9 is a diagram showing a process of manufacturing a semiconductor optical element and an optical module according to the second embodiment of the present invention.

An SiO$_2$ mask 201 is thereafter formed on the portions in the laser element portions 121a and 121b to be formed as active layers, and the p-type InP cladding layer 133, the i-type MQW core layer 132 and the n-type InP cladding layer 131 are removed by etching FIG. 9 shows a state after removal of the layers. Part 101a of the upper surface of the n-type InP substrate 101 is exposed by this etching (Step S203)

Figure 10:
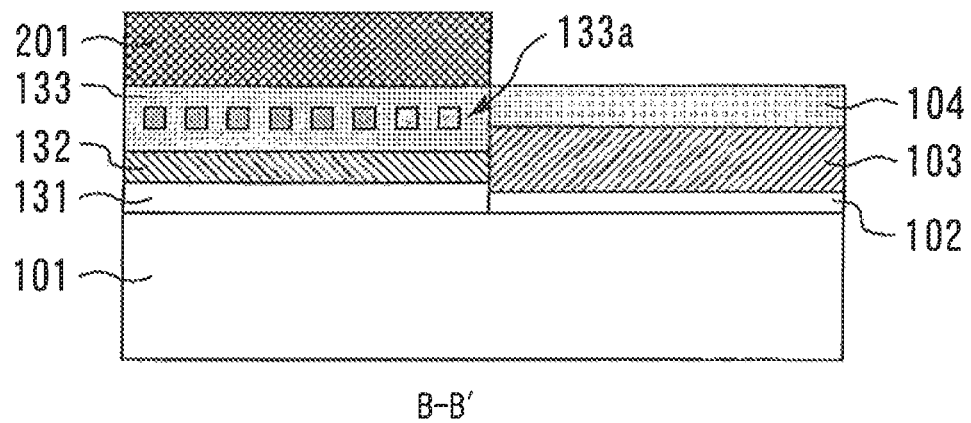
FIG. 10 is a diagram showing a process of manufacturing a semiconductor optical element and an optical module according to the second embodiment of the present invention.
Figure 11:
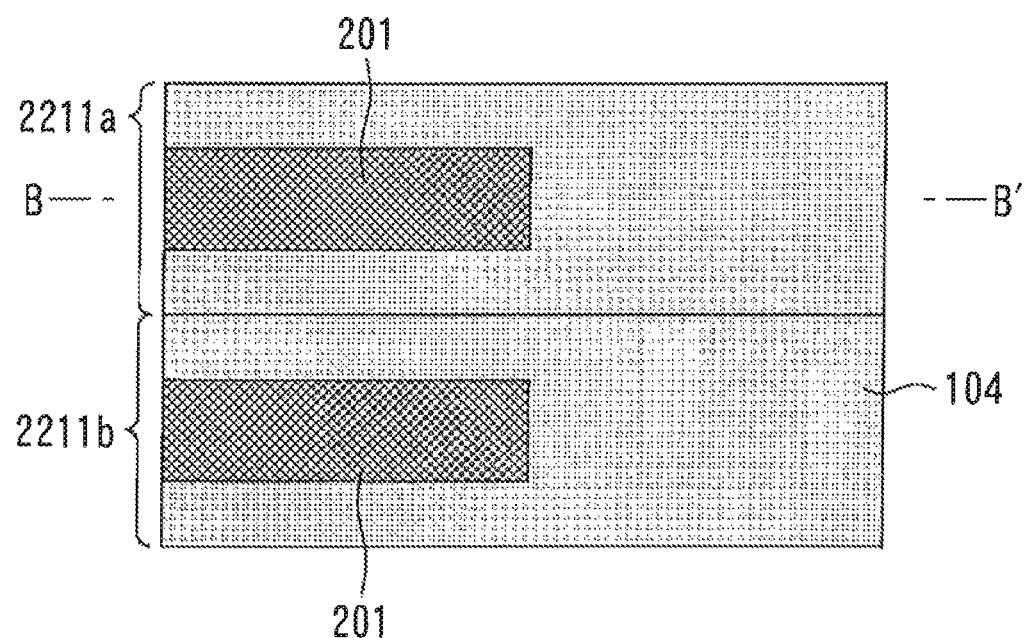
FIG. 11 is a diagram showing a process of manufacturing a semiconductor optical element and an optical module according to the second embodiment of the present invention.

Next, as shown in FIG. 10, the n-type InP cladding layer 102, the i-type InGaAsP MQW core layer 103 and the p-type InP cladding layer 104 for the integrated optical modulation element portion 221a are butt-joint-grown with the MOCVD apparatus again used, with the SiO$_2$ mask 201 used as a selective growth mask. FIG. 11 is a corresponding top view.

FIG. 10 is a sectional view of the monolithic optical element 221 in the course of manufacturing, taken along line B-B' in FIG. 11. A portion 2211a of the monolithic optical element 221 shown in the upper half of the plane of FIG. 11 forms the integrated optical modulation element portion 221a after the completion of the optical module 210. A portion 2211b of the monolithic optical element 221 shown in the lower half of the plane of FIG. 11 forms the integrated optical modulation element portion 221b after the completion of the optical module 210.

(Step S204)

Thereafter, the SiO$_2$ mask 201 is temporarily removed. After removal, SiO$_2$ masks are again formed on the active layer portion in the laser element portion 121a in the integrated optical modulation element portion 221a, the active layer portion in the laser element portion 121b in the integrated optical modulation element portion 221b, and the absorption layer forming portion in the EAM portion 122a in the integrated optical modulation element portion 221a. Then the p-type InP cladding layer 133, the i-type MQW core layer 132 and the n-type InP cladding layer 131 are removed by etching Part of the surface of the n-type InP substrate 101 is exposed by this etching.

(Step S205)

Next, the n-type InP cladding layer, the i-type InGaAsP MQW core layer and the p-type InP cladding layer for the integrated optical modulation element portion 221b are butt-joint-grown on the surface exposed by the above-described wet etching, with the MOCVD apparatus again used, with the SiO$_2$ masks used as selective growth masks. The composition ratios of the layers are adjusted according to the necessary factors including the barrier layer bandgap wavelengths and photoluminescence wavelengths. After the butt-joint growth, the SiO$_2$ masks are removed.

Figure 12:
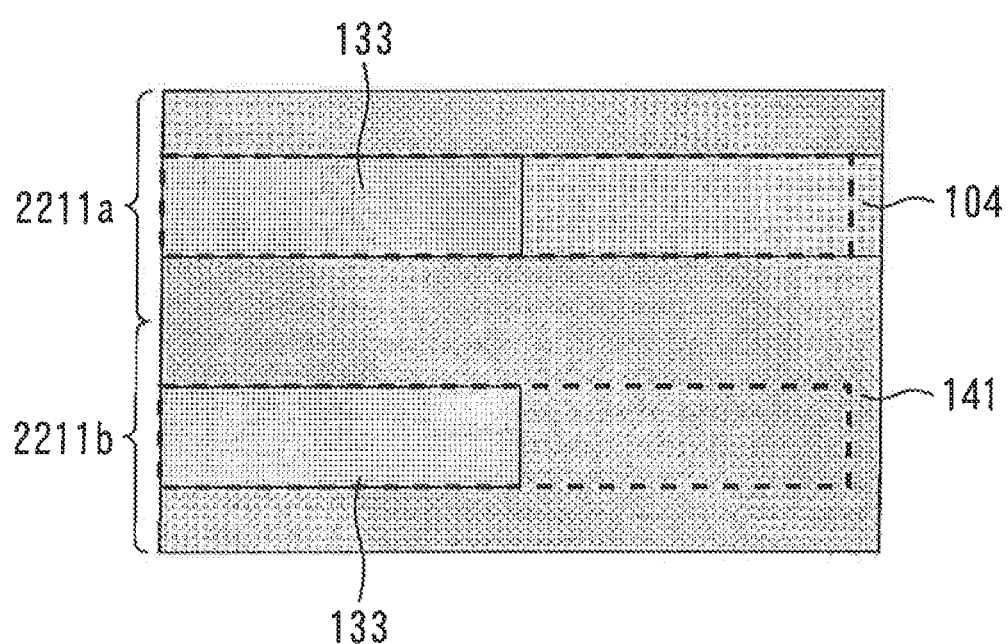
FIG. 12 is a diagram showing a process of manufacturing a semiconductor optical element and an optical module according to the second embodiment of the present invention.
Figure 13:
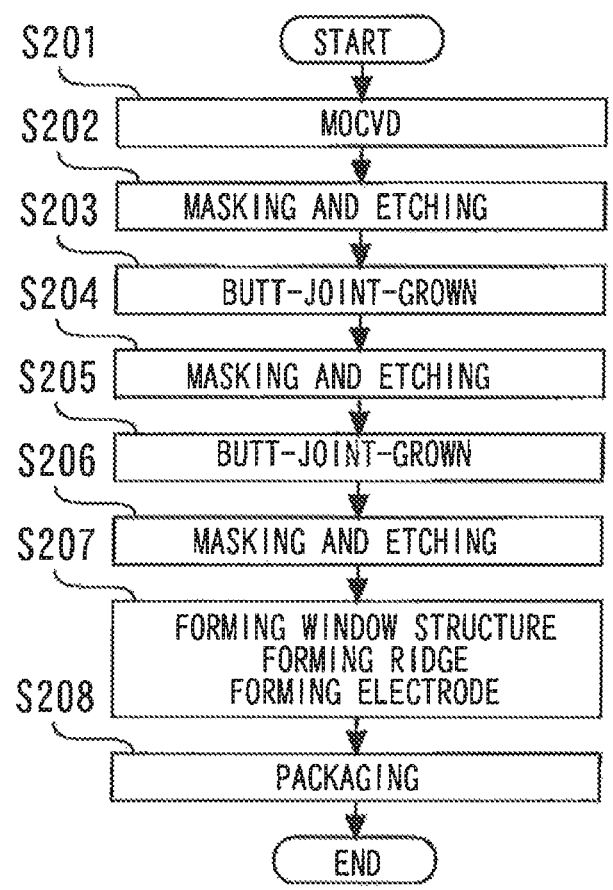
FIG. 13 is a flowchart showing a method of manufacturing a semiconductor optical element and an optical module according to the second embodiment of the present invention.

FIG. 12 is a top view of after the butt-joint growth. In the portions 2211a and 2211b, the p-type InP cladding layer 133 for the respective laser element portions 121a and 121b in the integrated optical modulation element portions 221a and 221b, the p-type InP cladding layer 104 for the EAM portion 122a in the integrated optical modulation element portion 221a and a p-type InP cladding layer 141 for the EAM portion 122b in the integrated optical modulation element portion 221b are laid. The quaternary mixed crystal diffraction grating layer 133a is provided in the p-type InP cladding layer 133.

(Step S206)

Thereafter, SiO$_2$ masks are again formed on the active layer portion in the laser element portion 121a in the integrated optical modulation element portion 221a, the active layer portion in the laser element portion 121b in the integrated optical modulation element portion 221b, the absorption layer forming portion in the EAM portion 122a in the integrated optical modulation element portion 221a, and the absorption layer forming portion in the EAM portion 122b in the integrated optical modulation element portion 221b. The p-type InP cladding layer 133, the i-type MQW core layer 132 and the n-type InP cladding layer 131 in the portions other than the portions masked with the SiO$_2$ masks again formed are removed by etching The portions on which the SiO$_2$ masks are provided are regions surrounded by thick broken lines in FIG. 12. Part of the surface of the n-type InP substrate 101 is exposed by this etching (Step S207)

The InP layer for the window structures 123 is then grown with the MOCVD apparatus again used, with the SiO$_2$ masks again formed in step S206 being used as selective growth masks. The SiO$_2$ masks are thereafter removed and the contact layers are grown with the MOCVD apparatus again used. Thereafter, the ridge waveguides are formed by etching and the p-side electrodes are formed on the contact layers. The n-type InP substrate 101 is ground to be made thinner and the n-side electrode is finally formed on the back surface of the n-type InP substrate 101.

Manufacturing of the monolithic optical element 221 is thus completed.

(Step S208)

After the completion of the monolithic optical element 221, the monolithic optical element 222 is manufactured in the same way. The monolithic optical element 221, the monolithic optical element 222, the wavelength multiplexer 12 and the signal input terminals 31 to 34 are packaged to provide the optical module 210.

By the manufacturing method according to the second embodiment described above, the two integrated optical modulation element portions 221a and 221b can be monolithically integrated on one n-type InP substrate 101, as shown in FIG. 7. As a result, two EAM portions 122 having different barrier layer bandgap wavelengths can be monolithically integrated.

Also in a case where a plurality of integrated optical modulation element portions having MQW core layers differing in photoluminescence (PL) wavelength are monolithically integrated, the integrated optical modulation element portions can be integrated by the same process as that in the second embodiment by suitably modifying the MQW core layer growth steps.

In the second embodiment, two integrated optical modulation element portions are monolithically integrated. However, the present invention is not limited to this. Three integrated optical modulation element portions may be monolithically integrated by using the manufacturing method according to the second embodiment. In such a case, butt-joint growth of MQW core layers is performed the number of times corresponding to the number of integrated optical modulation element portions. Techniques for this butt-joint growth are known per se and are not a novel matter. Therefore, no detailed description of them will be made.

Third Embodiment
<Construction of Device in Third Embodiment>

Figure 14:
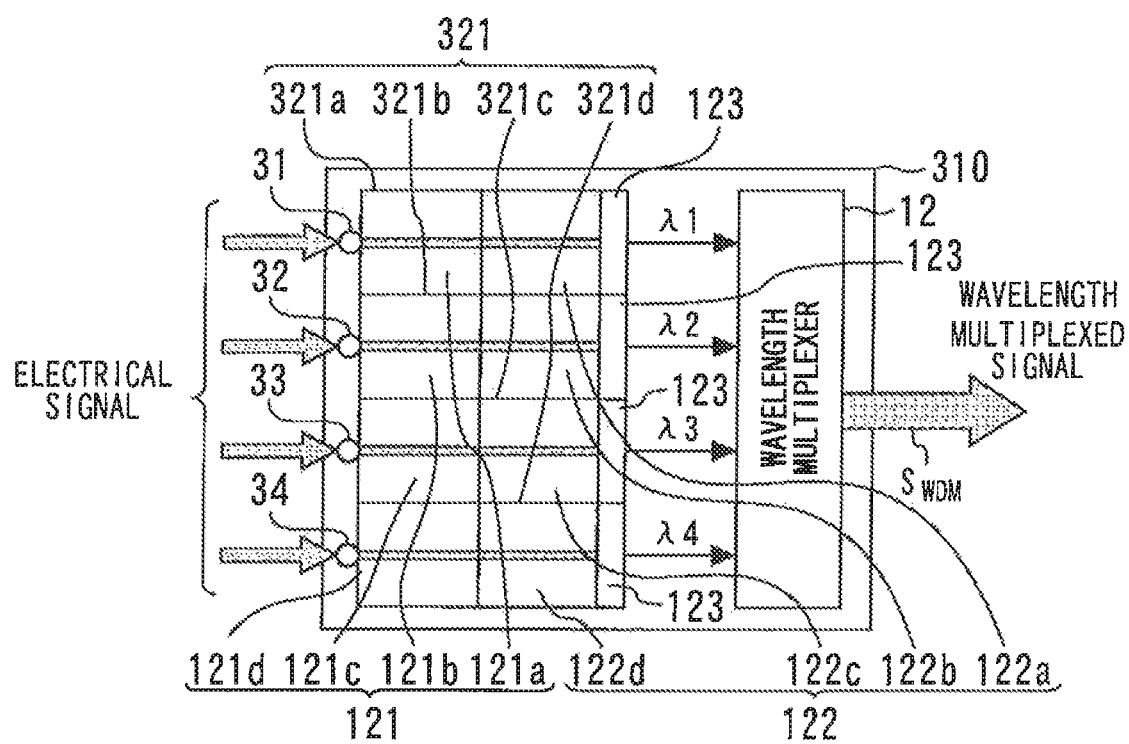
FIG. 14 is a diagram showing an optical module and a semiconductor optical element according a third embodiment of the present invention.

FIG. 14 is a block diagram of an optical module 310 according to a third embodiment of the present invention. The optical module 310 is a wavelength division multiplexing communication optical module used in a 100-Gbit/s optical communication system.

The optical module 310 has a monolithic optical element 321. The monolithic optical element 321 has four integrated optical modulation element portions 321a, 321b, 321c, and 321d monolithically integrated.

The integrated optical modulation element portions 321a to 321d seen as a single element respectively have the same constructions as those of the integrated optical modulation elements 21 to 24 according to the first embodiment.

That is, the integrated optical modulation element portion 321a has the same construction as that of the integrated optical modulation element 21. Accordingly, the integrated optical modulation element portion 321a has the oscillation wavelength $\lambda_{LD}1$, the barrier layer bandgap wavelength $\lambda_{BG}1$ and the photoluminescence wavelength $\lambda_{PL}1$, as does the integrated optical modulation element 21.

The integrated optical modulation element portion 321b has the same construction as that of the integrated optical modulation element 22. Accordingly, the integrated optical modulation element portion 321b has the oscillation wavelength $\lambda_{LD}2$, the barrier layer bandgap wavelength $\lambda_{BG}2$ and the photoluminescence wavelength $\lambda_{PL}2$, as does the integrated optical modulation element 22.

The integrated optical modulation element portion 321c has the same construction as that of the integrated optical modulation element 23. Accordingly, the integrated optical modulation element portion 321c has the oscillation wavelength $\lambda_{LD}3$, the barrier layer bandgap wavelength $\lambda_{BG}3$ and the photoluminescence wavelength $\lambda_{PL}3$, as does the integrated optical modulation element 23.

The integrated optical modulation element portion 321d has the same construction as that of the integrated optical modulation element 24. Accordingly, the integrated optical modulation element portion 321d has the oscillation wavelength $\lambda_{LD}4$, the barrier layer bandgap wavelength $\lambda_{BG}4$ and the photoluminescence wavelength $\lambda_{PL}4$, as does the integrated optical modulation element 24.

In the optical module 310, therefore, each of the magnitudes of variations of $\Delta\lambda_{LDPL}$ and $\Delta\lambda_{LDBG}$ is limited within the range from −1 nm to +1 nm, as is that in the optical module 10 according to the first embodiment.

Figure 15:
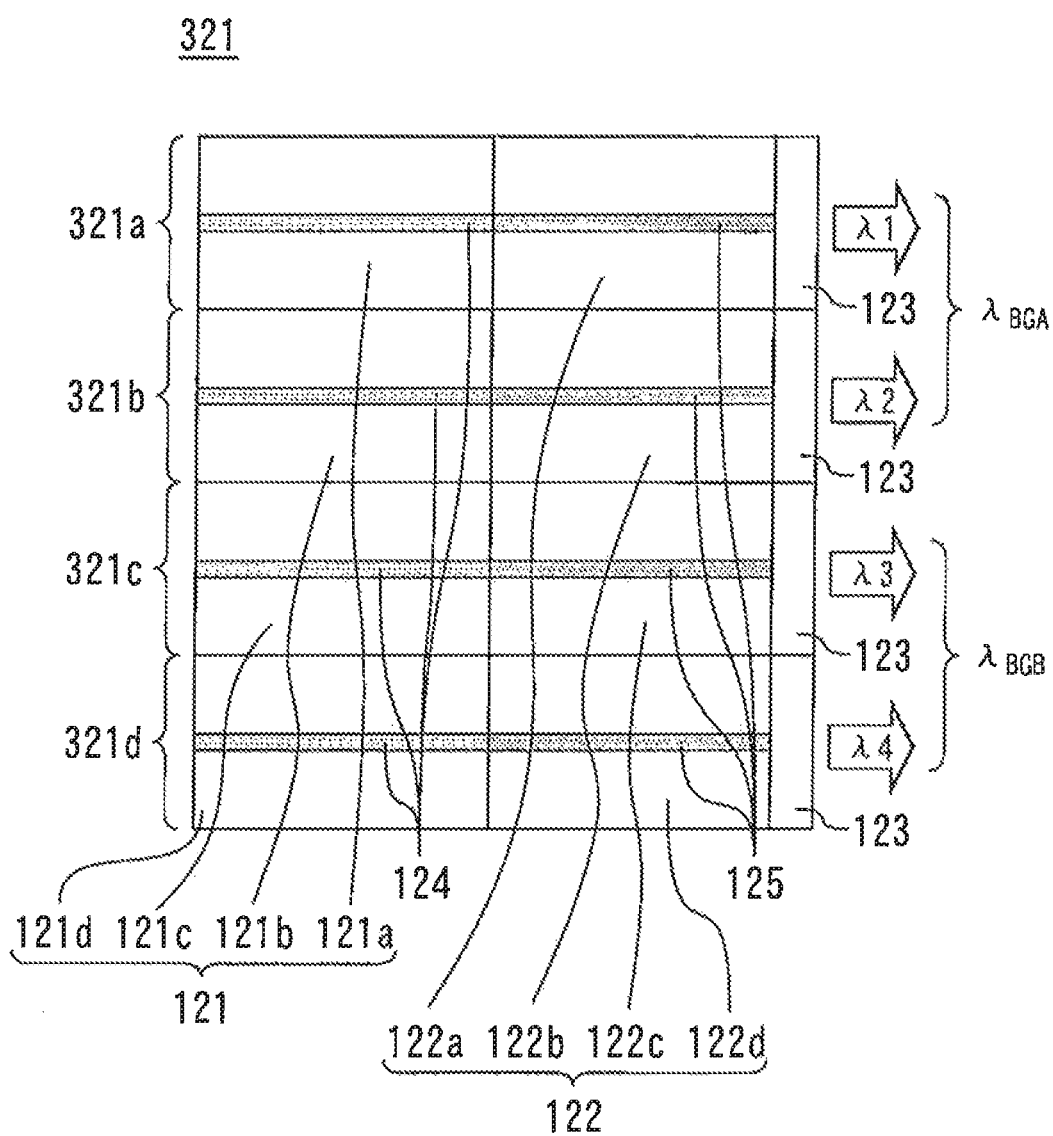
FIG. 15 is a diagram showing a semiconductor optical element according the third embodiment of the present invention.

FIG. 15 is a top view of the monolithic optical element 321. The integrated optical modulation element portions 321a to 321d respectively have laser element portions 121a to 121d, EAM portions 122a to 122d, and window structures 123. The laser element portions 121a to 121d include waveguides 124, and the EAM portions 122a to 122d include waveguides 125.

The barrier layer bandgap wavelength $\lambda_{BG}1$ that the EAM portion 122a in the integrated optical modulation element portion 321a has and the barrier layer bandgap wavelength $\lambda_{BG}2$ that the EAM portion 122b in the integrated optical modulation element portion 321b has are equal to each other.

The barrier layer bandgap wavelength $\lambda_{BG}3$ that the EAM portion 122c in the integrated optical modulation element portion 321c has and the barrier layer bandgap wavelength $\lambda_{BG}4$ that the EAM portion 122d in the integrated optical modulation element portion 321d has are equal to each other.

<Manufacturing Method According to Third Embodiment>

FIGS. 16 to 21 are diagrams showing a process of manufacturing the optical module 310 according to the third embodiment of the present invention. FIG. 22 is a flowchart showing a method of manufacturing the optical module 310 according to the third embodiment of the present invention.

The manufacturing method according to the third embodiment enables growing MQW core layers having different barrier layer bandgap wavelengths on one semiconductor substrate. The manufacturing method according to the third embodiment enables easy adjustment of the oscillation wavelengths, the barrier layer bandgap wavelengths and the photoluminescence wavelengths described in the description of the first embodiment.

(Step S301)

Figure 16:
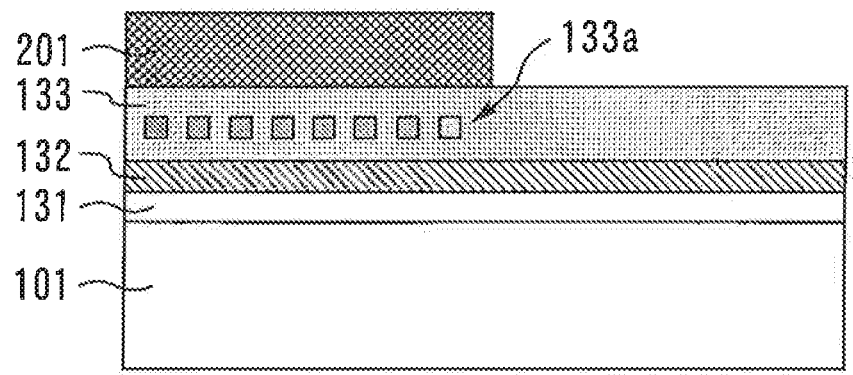
FIG. 16 is a diagram showing a process of manufacturing a semiconductor optical element and an optical module according to the third embodiment of the present invention.

First, as shown in FIG. 16, an n-type InP cladding layer 131, a quaternary mixed crystal i-type MQW core layer 132 and a p-type InP cladding layer 133 are grown on the n-type InP substrate 101 by metal organic chemical vapor deposition (MOCVD). A quaternary mixed crystal diffraction grating layer 133a is provided in the p-type InP cladding layer 133.

(Step S302)

Figure 17:
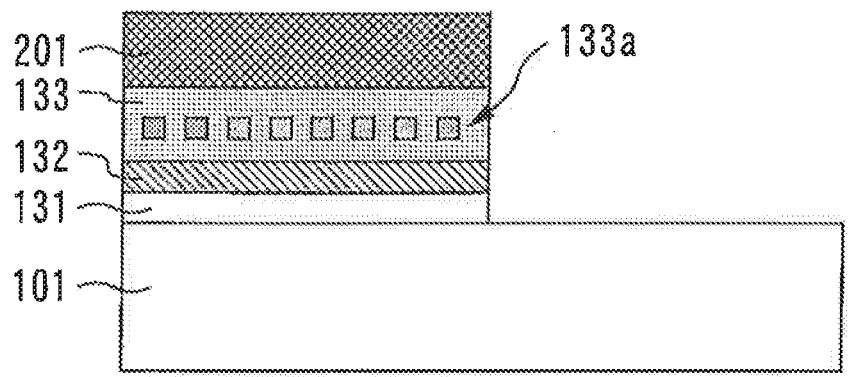
FIG. 17 is a diagram showing a process of manufacturing a semiconductor optical element and an optical module according to the third embodiment of the present invention.

An SiO$_2$ mask 201 is thereafter formed on the portions in the laser element portions 121 to be formed as active layers, and the p-type InP cladding layer 133, the i-type MQW core layer 132 and the n-type InP cladding layer 131 are removed by etching. Part of the surface of the n-type InP substrate 101 is exposed by this etching FIG. 17 shows a state after removal of the layers.

(Step S303)

Figure 18:
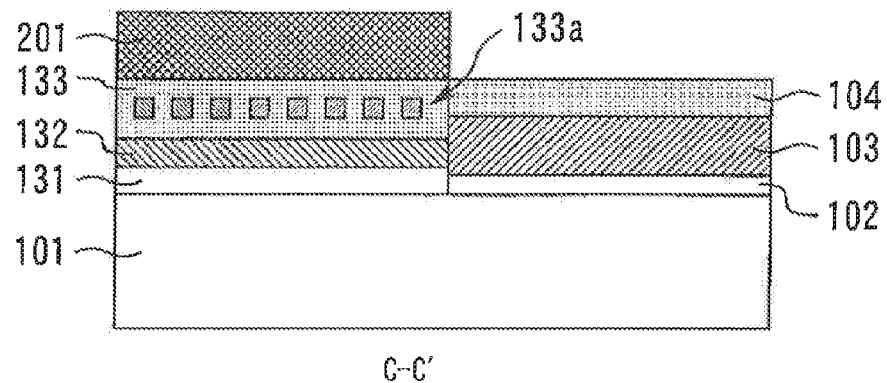
FIG. 18 is a diagram showing a process of manufacturing a semiconductor optical element and an optical module according to the third embodiment of the present invention.

Next, as shown in FIG. 18, the n-type InP cladding layer 102, the i-type InGaAsP MQW core layer 103 and the p-type InP cladding layer 104 for the integrated optical modulation element portions 321a and 321b are butt-joint-grown with the MOCVD apparatus again used, with the SiO$_2$ mask 201 used as a selective growth mask.

Figure 19:
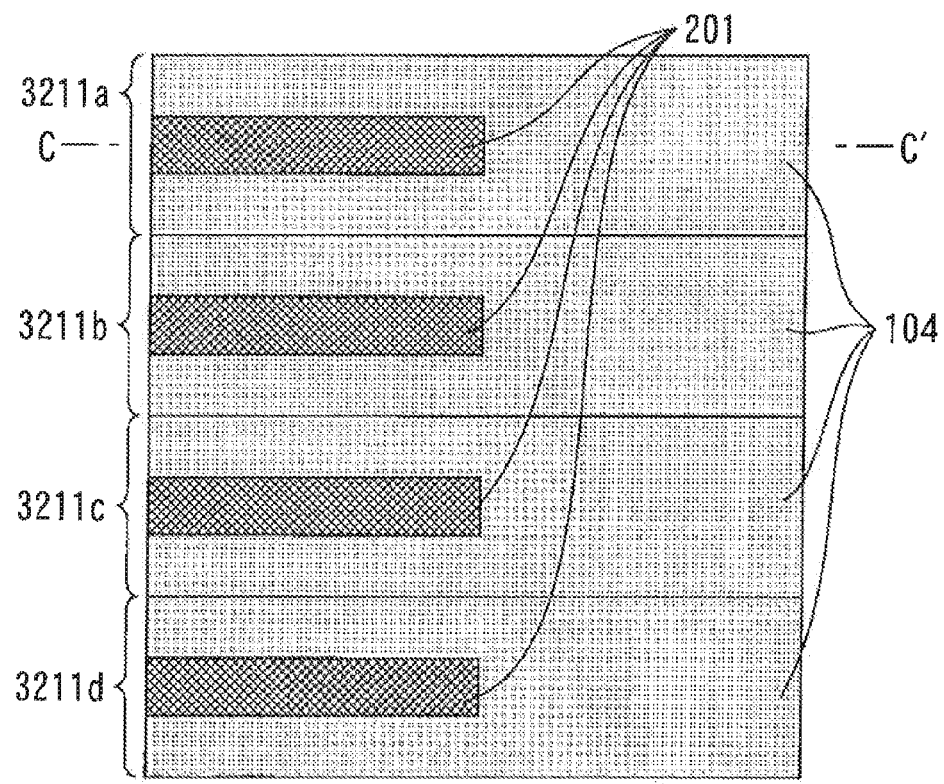
FIG. 19 is a diagram showing a process of manufacturing a semiconductor optical element and an optical module according to the third embodiment of the present invention.

FIG. 19 is a top view of the optical module 310 in the course of manufacturing immediately after step S303. FIG. 18 is a sectional view taken along line C-C' in FIG. 19. Portions 3211a, 3211b, 3211c, and 3211d arranged along a top-to-bottom direction as seen in FIG. 19 are completed. The portions 3211a, 3211b, 3211c, and 3211d respectively form the integrated optical modulation element portions 321a, 321b, 321c, and 321d after the completion of the optical module 310.

(Step S304)

Figure 20:
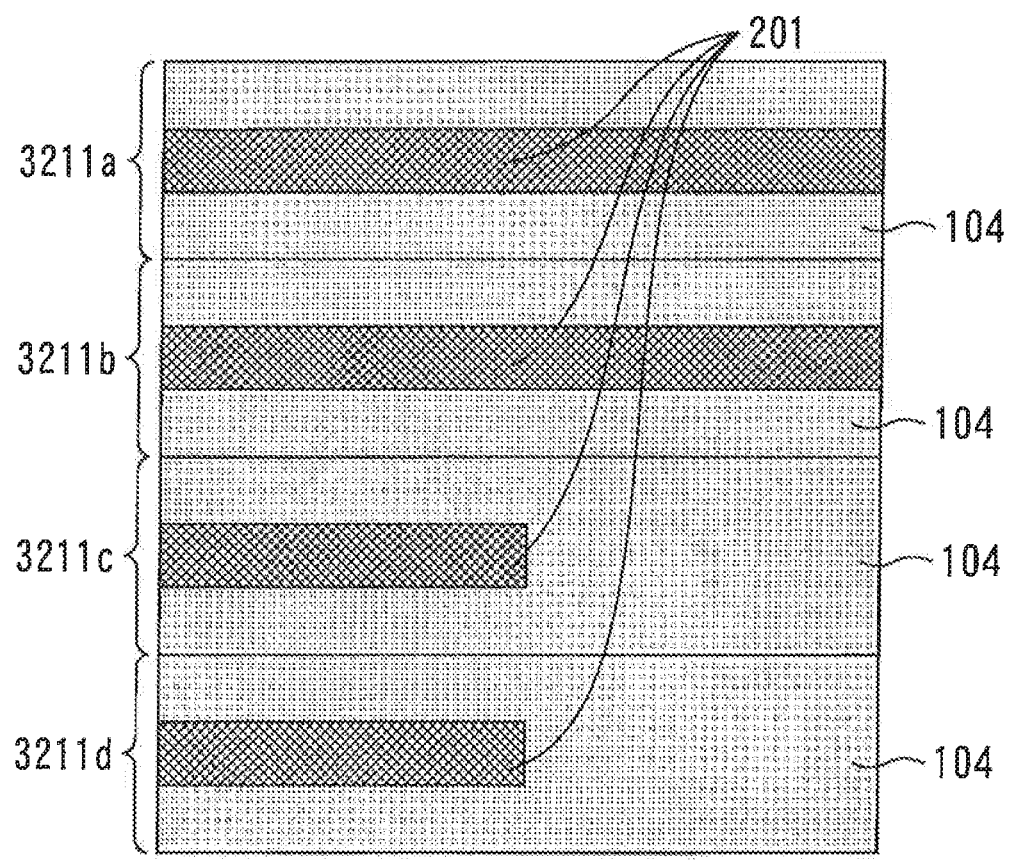
FIG. 20 is a diagram showing a process of manufacturing a semiconductor optical element and an optical module according to the third embodiment of the present invention.

Thereafter, the SiO$_2$ mask 201 is temporarily removed. After removal, the SiO$_2$ masks are again formed on the active layer portions in the laser element portions 121 in the integrated optical modulation element portions 321a, 321b, 321c, and 321d, and the absorption layer forming portions in the EAM portion 122 in the integrated optical modulation element portions 321a and 321b. FIG. 20 shows this state. The p-type InP cladding layer 133, the i-type MQW core layer 132 and the n-type InP cladding layer 131 in the portions other than the portions masked with the SiO$_2$ masks are removed by etching. Part of the surface of the n-type InP substrate 101 is exposed by this etching (Step S305)

Next, the n-type InP cladding layer, the i-type InGaAsP MQW core layer and the n-type InP cladding layer for the integrated optical modulation element portions 321c and 321d are butt-joint-grown with the MOCVD apparatus again used, with the SiO$_2$ masks again formed being used as selective growth masks. After the butt-joint growth, the SiO$_2$ masks are removed.

Figure 21:
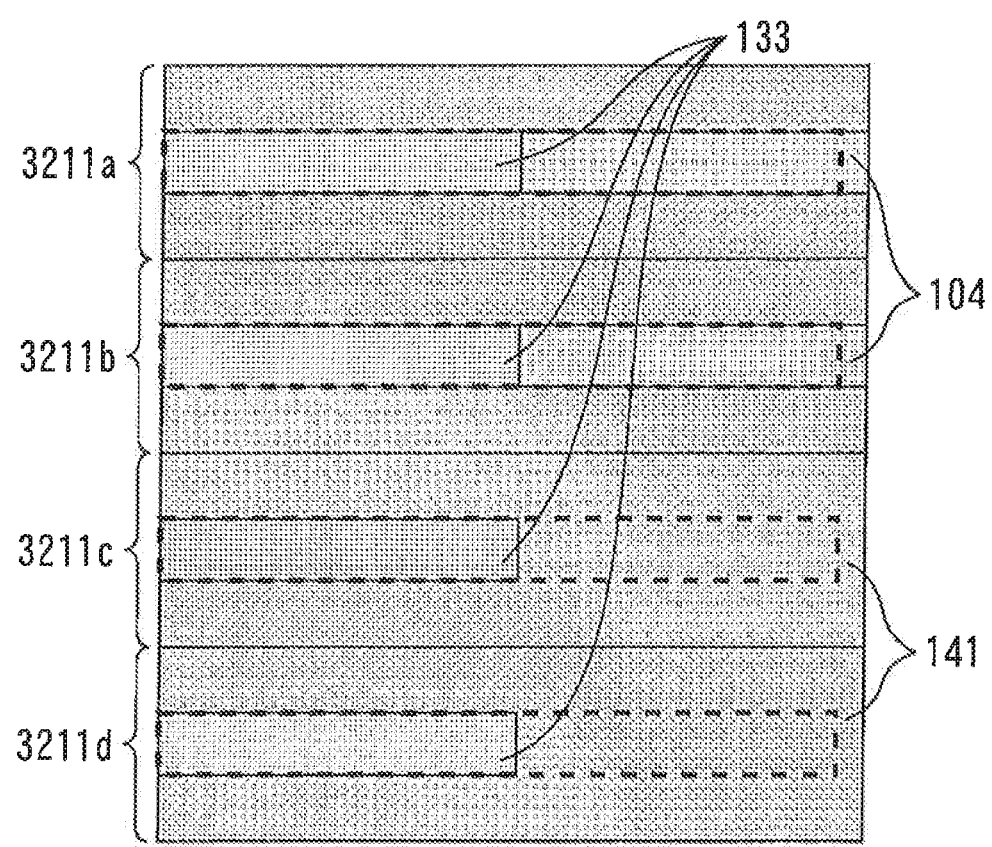
FIG. 21 is a diagram showing a process of manufacturing a semiconductor optical element and an optical module according to the third embodiment of the present invention.
Figure 22:
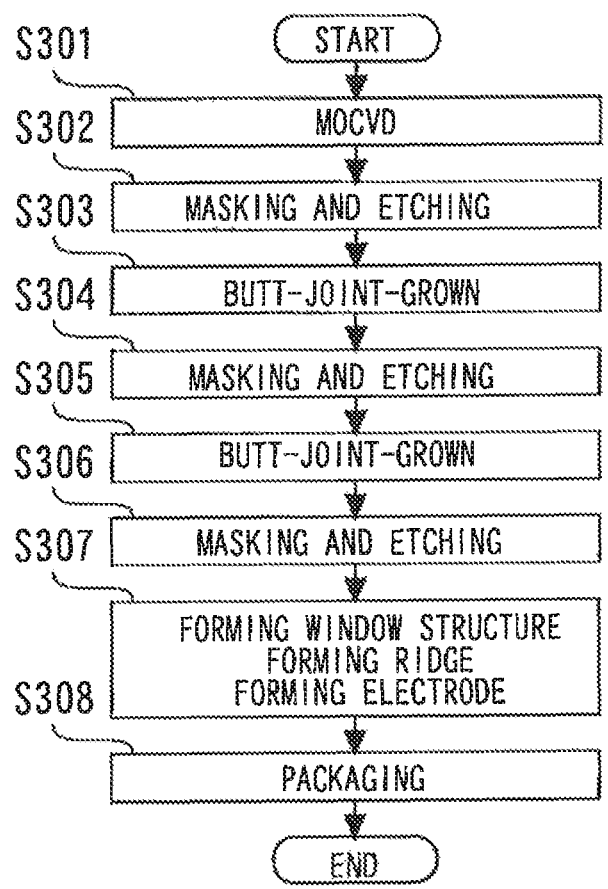
FIG. 22 is a flowchart showing a method of manufacturing a semiconductor optical element and an optical module according to the third embodiment of the present invention.

FIG. 21 is a top view of after the butt-joint growth. The p-type InP cladding layer 133, the p-type InP cladding layer 104 for the integrated optical modulation element portions 321a and 321b and a p-type InP cladding layer 141 for the integrated optical modulation element portions 321c and 321d are laid.

(Step S306)

Thereafter, SiO$_2$ masks are again formed on the active layer portions in the laser element portions 121a to 121d and the absorption layer forming portions in the EAM portions 122a to 122d. The p-type InP cladding layer 133, the i-type MQW core layer 132 and the n-type InP cladding layer 131 in the portions other than the portions masked with the SiO$_2$ mask again formed are removed by etching The portions on which the SiO$_2$ masks are provided are regions surrounded by thick broken lines in FIG. 21. Part of the surface of the n-type InP substrate 101 is exposed by this etching (Step S307)

The InP layer for the window structures 123 is then grown with the MOCVD apparatus again used, with the SiO$_2$ masks again formed in step S306 being used as selective growth masks. The SiO$_2$ masks are thereafter removed and the contact layers are grown with the MOCVD apparatus again used. Thereafter, the semiconductor multilayer structure that has been grown is partially etched to form the ridge portions. The p-side electrodes are formed on the contact layers on the upper surfaces of the ridge portions. The n-type InP substrate 101 is ground to be made thinner and the n-side electrode is finally formed on the back surface of the n-type InP substrate 101.

Manufacturing of the monolithic optical element 321 is thus completed.

(Step S308)

The monolithic optical element 321, the wavelength multiplexer 12 and the signal input terminals 31 to 34 are packaged to provide the optical module 310.

By the manufacturing method according to the third embodiment described above, the four integrated optical modulation element portions 321a to 321d can be monolithically integrated on one n-type InP substrate 101, as shown in FIG. 15. As a result, four EAM portions 122a to 122d having different barrier layer bandgap wavelengths $\lambda_{BG}1$ to $\lambda_{BG}4$ can be monolithically integrated.

Also in a case where a plurality of integrated optical modulation element portions having MQW core layers differing in photoluminescence (PL) wavelength are monolithically integrated, the integrated optical modulation element portions can be integrated by the same process as that in the third embodiment by suitably modifying the MQW core layer growth steps.

The manufacturing method according to the third embodiment includes two process steps for growing the MQW core layers of the EAM portions 122a to 122d. The MQW core layers in the EAM portions 122a and 122b in the integrated optical modulation element portions 321a and 321b are grown simultaneously with each other. The MQW core layers in the EAM portions 122c and 122d in the integrated optical modulation element portions 321c and 321d are grown simultaneously with each other. The MQW core layers in the four EAM portions 122a to 122d can thus be formed in the two growth process steps.

If MQW core layer butt-joint growth is separately performed for each of the four integrated optical modulation element portions, a total of four growth process steps are required. In contrast, two growth process steps suffice in the third embodiment. The number of process steps can thus be reduced.

The values of the barrier layer bandgap wavelengths $\lambda_{BG}1$ and $\lambda_{BG}2$ of the integrated optical modulation element portions 321a and 321b are equal to each other. The values of the barrier layer bandgap wavelengths $\lambda_{BG}3$ and $\lambda_{BG}4$ of the integrated optical modulation element portions 321c and 321d are equal to each other.

The value of the barrier layer bandgap wavelengths $\lambda_{BG}1$ and $\lambda_{BG}2$ is assumed to be $\lambda_{BG}A$, and the value of the barrier layer bandgap wavelengths $\lambda_{BG}3$ and $\lambda_{BG}4$ is assumed to be $\lambda_{BG}B$. The absolute value of the difference between $\lambda_{LD}1$ and $\lambda_{BG}A$ is assumed to be $\Delta\lambda_{LDBG}A$, and the absolute value of the difference between $\lambda_{LD}3$ and $\lambda_{BG}B$ is assumed to be $\Delta\lambda_{LDBG}B$. $\Delta\lambda_{LDBG}A$ and $\Delta\lambda_{LDBG}B$ are obtained by the following equations:

$$\Delta\lambda_{LDBG}A = |\lambda_{LD}1 - \lambda_{BG}A| \tag{13}$$

$$\Delta\lambda_{LDBG}B = |\lambda_{LD}3 - \lambda_{BG}B| \tag{14}$$

In the third embodiment, the difference between $\Delta\lambda_{LDBG}A$ and $\Delta\lambda_{LDBG}B$ is set within the range from −1 nm to +1 nm, thus enabling inhibition of variation of characteristics among the different integrated optical modulation element portions.

In the third embodiment, the effect of reducing the number of times MQW core layer butt-joint growth is performed can be obtained in a case where electric-field-absorption-type optical modulators for operation with three wavelengths or more are monolithically integrated.

Fourth Embodiment

<Construction of Device in Fourth Embodiment>

Figure 23:
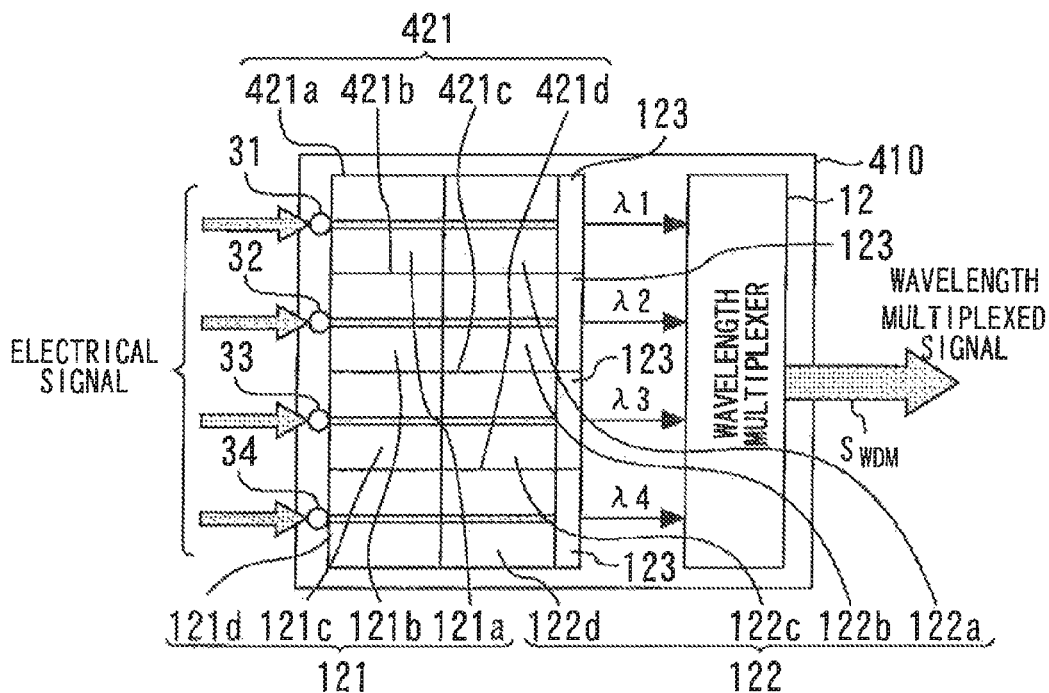
FIG. 23 is a diagram showing an optical module and a semiconductor optical element according a fourth embodiment of the present invention.

FIG. 23 is a block diagram of an optical module 410 according to a fourth embodiment of the present invention. The optical module 410 is a wavelength division multiplexing communication optical module used in a 100-Gbit/s optical communication system.

The optical module 410 has a monolithic optical element 421. The monolithic optical element 421 has four integrated optical modulation element portions 421a, 421b, 421c, and 421d monolithically integrated.

In comparison of the multilayer structure of each element portion, the integrated optical modulation element portions 421a to 421d respectively have the same constructions as those of the integrated optical modulation elements 21 to 24 according to the first embodiment.

That is, the integrated optical modulation element portion 421a has the same construction as that of the integrated optical modulation element 21. Accordingly, the integrated optical modulation element portion 421a has the oscillation wavelength $\lambda_{LD}1$, the barrier layer bandgap wavelength $\lambda_{BG}1$ and the photoluminescence wavelength $\lambda_{PL}1$, as does the integrated optical modulation element 21.

The integrated optical modulation element portion 421b has the oscillation wavelength $\lambda_{LD}2$, the barrier layer bandgap wavelength $\lambda_{BG}2$ and the photoluminescence wavelength $\lambda_{PL}2$, as does the integrated optical modulation element 22.

The integrated optical modulation element portion 421c has the oscillation wavelength $\lambda_{LD}3$, the barrier layer bandgap wavelength $\lambda_{BG}3$ and the photoluminescence wavelength $\lambda_{PL}3$, as does the integrated optical modulation element 23.

The integrated optical modulation element portion 421d has the oscillation wavelength $\lambda_{LD}4$, the barrier layer bandgap wavelength $\lambda_{BG}4$ and the photoluminescence wavelength $\lambda_{PL}4$, as does the integrated optical modulation element 24.

In the optical module 410, therefore, each of the magnitudes of variations of $\Delta\lambda_{LDPL}$ and $\Delta\lambda_{LDBG}$ is limited within the range from −1 nm to +1 nm, as is that in the optical module 10 according to the first embodiment.

Figure 24:
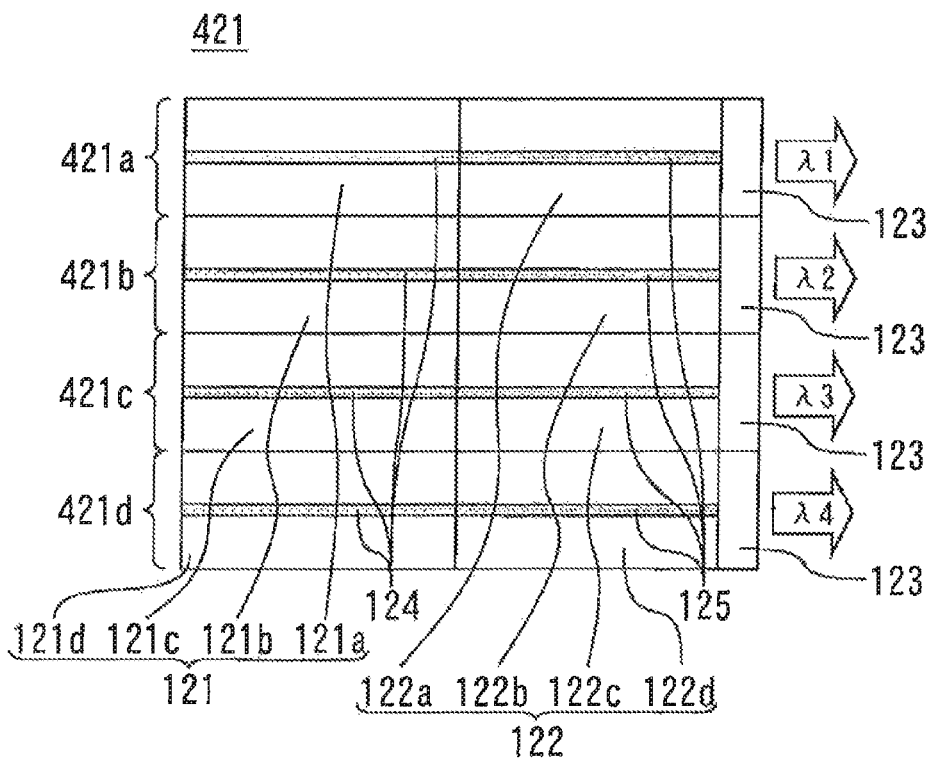
FIG. 24 is a diagram showing a semiconductor optical element according the fourth embodiment of the present invention.

FIG. 24 is a top view of the monolithic optical element 421. The integrated optical modulation element portions 421a to 421d respectively have laser element portions 121a to 121d, EAM portions 122a to 122d, and window structures 123. The laser element portions 121a to 121d include waveguides 124, and the EAM portions 122a to 122d include waveguides 125.

<Manufacturing Method According to Fourth Embodiment>

Figure 25:
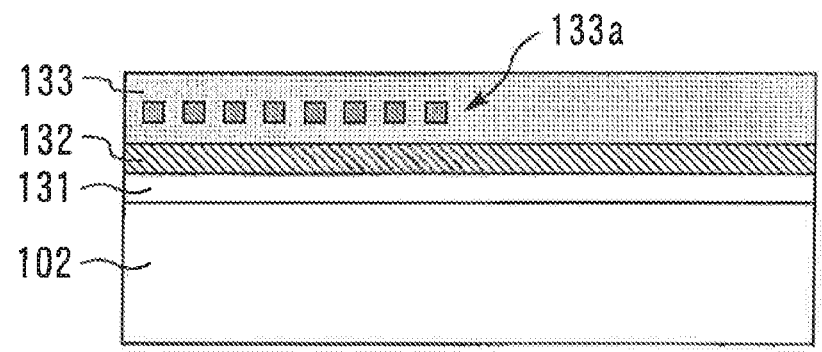
FIG. 25 is a diagram showing a process of manufacturing a semiconductor optical element and an optical module according to the fourth embodiment of the present invention.
Figure 26:
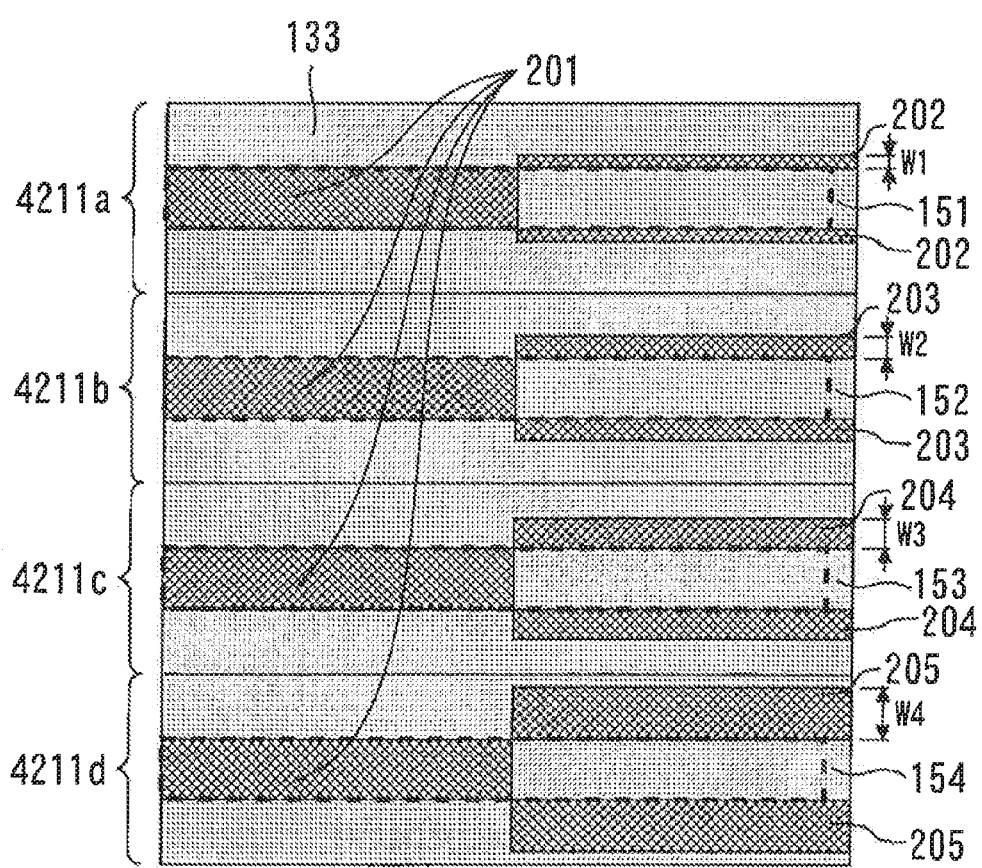
FIG. 26 is a diagram showing a process of manufacturing a semiconductor optical element and an optical module according to the fourth embodiment of the present invention.
Figure 27:
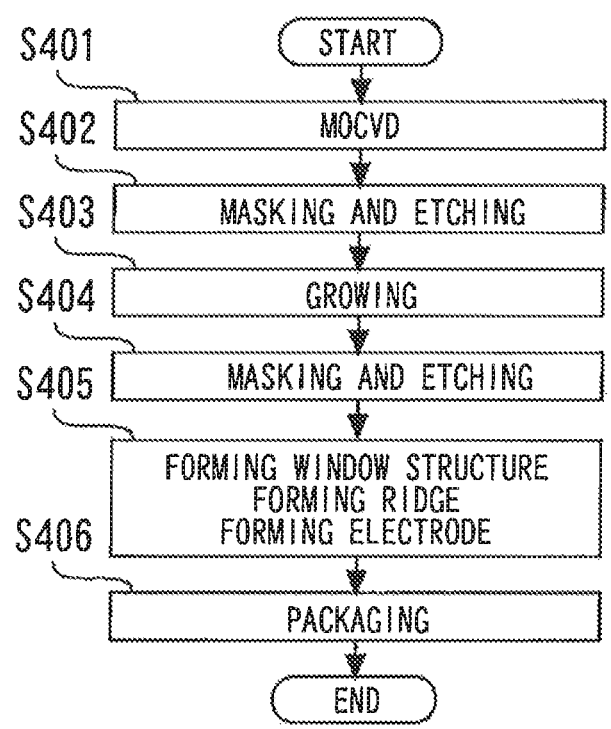
FIG. 27 is a flowchart showing a method of manufacturing a semiconductor optical element and an optical module according to the fourth embodiment of the present invention.

FIGS. 25 and 26 are diagrams showing a process of manufacturing the optical module 410 according to the fourth embodiment of the present invention. FIG. 25 is a sectional view of the optical module 410 in the course of manufacturing. FIG. 26 is a top view of the optical module 410 in the course of manufacturing. FIG. 27 is a flowchart showing a method of manufacturing the optical module 410 according to the fourth embodiment of the present invention.

The manufacturing method according to the fourth embodiment enables growing MQW core layers having different barrier layer bandgap wavelengths on one semiconductor substrate. The manufacturing method according to the fourth embodiment enables easy adjustment of the oscillation wavelengths, the barrier layer bandgap wavelengths and the photoluminescence wavelengths described in the description of the first embodiment.

(Step S401)

As shown in the sectional view of FIG. 25, an n-type InP cladding layer 131, a quaternary mixed crystal i-type MQW core layer 132 and a p-type InP cladding layer 133 are grown on the n-type InP substrate 101 by MOCVD. A quaternary mixed crystal diffraction grating layer 133a is provided in the p-type InP cladding layer 133.

(Step S402)

Next, as shown in the top view of FIG. 26, SiO$_2$ masks 201, 202, 203, 204, and 205 are formed on the upper surface of the p-type InP cladding layer 133. More specifically, the SiO$_2$ mask 201 is formed on the active layer portions in the laser element portions 121a to 121d.

Referring to the diagram showing a state in the course of manufacturing, portions 4211a, 4211b, 4211c, and 4211d arranged along a top-to-bottom direction as seen in FIG. 26 are completed. The portions 4211a to 4211d respectively form the integrated optical modulation element portions 421a to 421d after the completion of the optical module 410.

An absorption layer forming portion 151 in the portion 4211a is a portion where the EAM portion 122a in the integrated optical modulation element portion 421a is to be formed. The SiO$_2$ mask 202 is formed on opposite sides of the absorption layer forming portion 151. The SiO$_2$ mask 202 is formed of two mask portions (i.e., a first portion and a second portion) extending parallel to each other, with the absorption layer forming portion 151 interposed therebetween.

Each of the SiO$_2$ masks 203 to 205 is formed in the same way. That is, an absorption layer forming portion 152 in the portion 4211b is a portion where the EAM portion 122b in the integrated optical modulation element portion 421b is to be formed. The SiO$_2$ mask 203 is formed on opposite sides of the absorption layer forming portion 152. An absorption layer forming portion 153 in the portion 4211c is a portion where the EAM portion 122c in the integrated optical modulation element portion 421c is to be formed. The SiO$_2$ mask 204 is formed on opposite sides of the absorption layer forming portion 153. An absorption layer forming portion 154 in the portion 4211d is a portion where the EAM portion 122d in the integrated optical modulation element portion 421d is to be formed. The SiO$_2$ mask 205 is formed on opposite sides of the absorption layer forming portion 154. Each of the SiO$_2$ masks 203 to 205 is also formed of two mask portions extending parallel to each other, with the respective absorption layer forming portions 152 to 154 interposed therebetween.

The SiO$_2$ masks 202, 203, 204, and 205 have widths W1, W2, W3, and W4 respectively along their shorter-side direction. These widths W1, W2, W3, and W4 differ from each other. More specifically, W1<W2<W3<W4.

The p-type InP cladding layer 133, the i-type MQW core layer 132 and the n-type InP cladding layer 131 in the portions on which the SiO$_2$ masks 202 to 205 are not formed are removed by etching. Part of the n-type InP substrate 101 is exposed by this etching.

(Step S403)

Next, the n-type InP cladding layer, the i-type InGaAsP MQW core layer and the p-type InP cladding layer for the EAM portions 122a to 122d are grown simultaneously with each other, with the SiO$_2$ masks 202 to 205 used as selective growth masks.

With the widths W1 to W4 of the SiO$_2$ masks 202 to 205, the barrier layer bandgap wavelengths $\lambda_{BG}1, \lambda_{BG}2, \lambda_{BG}3$, and $\lambda_{BG}4$ of the respective integrated optical modulation element portions 421a, 421b, 421c, and 421d can be adjusted to the desired values.

(Step S404)

The SiO$_2$ masks are thereafter temporarily removed. After removal, the SiO$_2$ masks are again formed on the active layer portions in the laser element portions 121a to 121d and the portions in the EAM portions 122a to 122d to be formed as light absorption layers. The p-type InP cladding layer 133, the i-type MQW core layer 132 and the n-type InP cladding layer 131 in the portions other than the portions masked with the SiO$_2$ masks again formed are removed by etching. The portions on which the SiO$_2$ masks are provided are regions surrounded by thick broken lines in FIG. 26. Part of the surface of the n-type InP substrate 101 is exposed by this etching.

(Step S405)

The InP layer for the window structures 123 is then grown with the MOCVD apparatus again used, with the SiO$_2$ masks again formed in step S404 being used as selective growth masks. The SiO$_2$ masks are thereafter removed and the contact layers are grown with the MOCVD apparatus again used. Thereafter, the ridge waveguides are formed by etching, and the p-side electrodes are formed on the contact layers. The n-type InP substrate 101 is thereafter ground to be made thinner and the n-side electrode is finally formed on the back surface of the n-type InP substrate 101.

Manufacturing of the monolithic optical element 421 is thus completed.

(Step S406)

The monolithic optical element 421, the wavelength multiplexer 12 and the signal input terminals 31 to 34 are packaged to provide the optical module 410.

By the manufacturing method according to the fourth embodiment described above, the four integrated optical modulation element portions 421a to 421d can be monolithically integrated on one n-type InP substrate 101, as shown in FIG. 24. That is, four EAM portions 122a to 122d having different barrier layer bandgap wavelengths $\lambda_{BG}1$ to $\lambda_{BG}4$ can be monolithically integrated.

In the manufacturing method according to the fourth embodiment, a process step for butt-joint growth of the MQW core layers in the EAM portions 122 is performed one time. Performing the growth process step one time suffices since the barrier layer bandgap wavelengths $\lambda_{BG}1$ to $\lambda_{BG}4$ are adjusted with the widths W1 to W4 of the SiO$_2$ masks 202 to 205.

The oscillation wavelengths $\lambda_{LD}1$ to $\lambda_{LD}4$ are considered for adjustment of the barrier layer bandgap wavelengths $\lambda_{BG}1$ to $\lambda_{BG}4$ with the widths W1 to W4. That is, the widths W1 to W4 may be adjusted so as to limit variations of the values of $\Delta\lambda_{LDBG}1$, $\Delta\lambda_{LDBG}2$, $\Delta\lambda_{LDBG}3$ and $\Delta\lambda_{LDBG}4$ within the predetermined range, as in the case of the first embodiment.

In the fourth embodiment, four integrated optical modulation element portions 421a to 421d are monolithically integrated. However, the present invention is not limited to this. The barrier layer bandgap wavelengths may also be adjusted with the widths of SiO$_2$ masks in a case where two or more integrated optical modulation element portions are monolithically integrated. Therefore, the manufacturing method according to the fourth embodiment can also be used in the same way in such a case.

The features and advantages of the present invention may be summarized as follows. According to the first and second aspects of the present invention, extinction ratio variation among the plurality of integrated optical modulation elements can be reduced by suitably setting the relationships between the oscillation wavelengths of the laser element portions and the barrier layer bandgap wavelengths of the quantum well core layers of the electric-field-absorption-type optical modulator portions. According to the third and fourth aspects of the present invention, a manufacturing method suitable for adjusting the relationships between the oscillation wavelengths of the laser element portions and the barrier layer bandgap wavelengths of the quantum well core layers of the electric-field-absorption-type optical modulator portions is provided.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-201572, filed on Sep. 27, 2013, including specification, claims, drawings, and summary, on which the Convention priority of the present application is based, is incorporated herein by reference in its entirety.

The invention claimed is:

1. A semiconductor optical element comprising a plurality of integrated optical modulation elements, each of the integrated optical modulation elements including:
   a laser element portion from which laser light having an oscillation wavelength emerges; and
   an electric-field-absorption optical modulator portion having a quantum well core layer that receives laser light from the laser element portion, the optical modulator portion providing optical modulation according to an input electrical signal, wherein
   the oscillation wavelength of the laser element portion that a second integrated optical modulation element, among the plurality of integrated optical modulation elements modulates, is longer than the oscillation wavelength of the laser element portion that a first integrated optical modulation element among the plurality of integrated optical modulation elements modulates, and
   bandgap wavelength of a barrier layer in the quantum well core layer of the second integrated optical modulation element is longer than bandgap wavelength of a barrier layer in the quantum well core layer of the first integrated optical modulation element.

2. The semiconductor optical element according to claim 1, wherein
   the plurality of integrated optical modulation elements includes a third integrated optical modulation element,
   when the oscillation wavelength of the laser element portion that the first integrated optical modulation element modulates is $\lambda_{LD}1$, the oscillation wavelength of the laser element portion that the second integrated optical modulation element modulates is $\lambda_{LD}2$, and the oscillation wavelength of the laser element portion that the third integrated optical modulation element modulates is $\lambda_{LD}3$, and
   when the bandgap wavelength of the barrier layer in the quantum well core layer in the first integrated optical modulation element is $\lambda_{BG}1$, the bandgap wavelength of the barrier layer in the quantum well core layer of the second integrated optical modulation element is $\lambda_{BG}2$, and bandgap wavelength of a barrier layer in the quantum well core layer of the third integrated optical modulation element is $\lambda_{BG}3$, then
   $\lambda_{LD}1 < \lambda_{LD}2 < \lambda_{LD}3$, and $\lambda_{BG}1 < \lambda_{BG}2 < \lambda_{BG}3$.

3. The semiconductor optical element according to claim 1, wherein
   when absolute value of difference between the oscillation wavelength of the laser element portion that the first integrated optical modulation element, among the plurality of integrated optical modulation elements, modulates, and the bandgap wavelength of the barrier layer in the quantum well core layer of the first integrated optical modulation element, is a first wavelength difference, and
   when absolute value of difference between the oscillation wavelength of the laser element portion that the second integrated optical modulation element, among the plurality of integrated optical modulation elements, modulates, and the bandgap wavelength of the barrier layer in the quantum well core layer of the second integrated optical modulation element, is a second wavelength difference, then
   difference between the first wavelength difference and the second wavelength difference is no larger than 10 nm.

4. The semiconductor optical element according to claim 3, wherein the difference between the first wavelength difference and the second wavelength difference is no larger than 6 nm.

5. The semiconductor optical element according to claim 4, wherein the difference between the first wavelength difference and the second wavelength difference is no larger than 2 nm.

6. The semiconductor optical element according to claim 1, wherein
   the plurality of integrated optical modulation elements includes at least three integrated optical modulation elements,
   each of the at least three integrated optical modulation elements has an LDBG wavelength difference that is a difference between the oscillation wavelength of the laser element portion of the integrated optical modulation element and bandgap wavelength of a barrier layer in the quantum well core layer of the integrated optical modulation element, and
   difference between the largest value and the smallest value of the LDBG wavelength differences of the at least three integrated optical modulation elements, respectively, is no larger than 10 nm.

7. The semiconductor optical element according to claim 6, wherein the difference between the largest value and the smallest value of the LDBG wavelength differences of the at least three integrated optical modulation elements, respectively, is no larger than 6 nm.

8. The semiconductor optical element according to claim 7, wherein the difference between the largest value and the smallest value of the LDBG wavelength differences of the at least three integrated optical modulation elements, respectively, is no larger than 2 nm.

9. The semiconductor optical element according to claim 1, wherein photoluminescence wavelength of the quantum well core layer of the second integrated optical modulation element is longer than photoluminescence wavelength of the quantum well core layer of the first integrated optical modulation element.

10. The semiconductor optical element according to claim 9, wherein
the plurality of integrated optical modulation elements includes a third integrated optical modulation element, and
when the oscillation wavelength of the laser element portion that the first integrated optical modulation element modulates is $\lambda_{LD}1$, the oscillation wavelength of the laser element portion that the second integrated optical modulation element modulates is $\lambda_{LD}2$, and the oscillation wavelength of the laser element portion that the third integrated optical modulation element modulates is $\lambda_{LD}3$, and
when the photoluminescence wavelength of the quantum well core layer of the first integrated optical modulation element is $\lambda_{PL}1$, the photoluminescence wavelength of the quantum well core layer of the second integrated optical modulation element is $\lambda_{PL}2$, and photoluminescence wavelength of the quantum well core layer of the third integrated optical modulation element is $\lambda_{PL}3$, then $\lambda_{LD}1<\lambda_{LD}2<\lambda_{LD}3$, and $\lambda_{PL}1<\lambda_{PL}2<\lambda_{PL}3$.

11. The semiconductor optical element according to claim 9, wherein
when absolute value of difference between the oscillation wavelength of the laser element portion that the first integrated optical modulation element modulates and the photoluminescence wavelength of the optical modulator portion that the first integrated optical modulation element modulates is a first wavelength difference, and
when absolute value of difference between the oscillation wavelength of the laser element portion that the second integrated optical modulation element modulates and the photoluminescence wavelength of the optical modulator portion that the second integrated optical modulation element modulates is a second wavelength difference, then
difference between the first wavelength difference and the second wavelength difference is no larger than 10 nm.

12. The semiconductor optical element according to claim 11, wherein the difference between first wavelength difference and the second wavelength difference is no larger than 6 nm.

13. The semiconductor optical element according to claim 12, wherein the difference between the first wavelength difference and the second wavelength difference is no larger than 2 nm.

14. The semiconductor optical element according to claim 9, wherein
the plurality of integrated optical modulation elements includes at least three integrated optical modulation elements,
each of the at least three integrated optical modulation elements has an LDPL wavelength difference that is a difference between the oscillation wavelength of the laser element portion of the integrated optical modulation element and photoluminescence wavelength of the electric-field-absorption optical modulator portion of the integrated optical modulation element, and
difference between the largest value and the smallest value of the LDPL wavelength differences of the at least three integrated optical modulation elements, respectively, is no larger than 10 nm.

15. The semiconductor optical element according to claim 14, wherein the difference between the largest value and the smallest value of the LDPL wavelength differences of the at least three integrated optical modulation elements, respectively, is no larger than 6 nm.

16. The semiconductor optical element according to claim 15, wherein the difference between the largest value and the smallest value of the LDPL wavelength differences of the at least three integrated optical modulation elements, respectively, is no larger than 2 nm.

17. The semiconductor optical element according to claim 1, wherein
the oscillation wavelengths of the laser element portions are within a range from 1250 nm to 1350 nm, and
the bandgap wavelengths of the quantum well core layers are within a range from 1000 nm to 1120 nm.

18. The semiconductor optical element according to claim 1, wherein the plurality of integrated optical modulation elements are monolithically formed on a single semiconductor substrate.

19. An optical module comprising:
a plurality of integrated optical modulation elements; and
a wavelength multiplexer that multiplexes light emergent from respective electric-field-absorption optical modulator portions of the plurality of integrated optical modulation elements, wherein each of the integrated optical modulation elements includes:
a signal input terminal;
a laser element portion from which laser light having an oscillation wavelength emerges; and
one of the electric-field-absorption optical modulator portions having a quantum well core layer that receives laser light from the laser element portion, the optical modulator portion providing optical modulation according to an input electrical signal from the signal input terminal, wherein
the oscillation wavelength of the laser element portion of a second integrated optical modulation element, among the plurality of integrated optical modulation elements, is longer than the oscillation wavelength of the laser element portion of a first integrated optical modulation element, among the plurality of integrated optical modulation elements, and
bandgap wavelength of a barrier layer in the quantum well core layer of the second integrated optical modulation element is longer than bandgap wavelength of a barrier layer in the quantum well core layer of the first integrated optical modulation element.

20. The optical module according to claim 19, wherein
the plurality of integrated optical modulation elements includes a third integrated optical modulation element, and
when the oscillation wavelength of the laser element portion of the first integrated optical modulation element is $\lambda_{LD}1$, the oscillation wavelength of the laser element portion of the second integrated optical modulation element is $\lambda_{LD}2$, and the oscillation wavelength of the laser element portion of the third integrated optical modulation element is $\lambda_{LD}3$, and when the bandgap wavelength of the barrier layer in the quantum well core layer of the first integrated optical modulation element is $\lambda_{BG}1$, the bandgap wavelength of the barrier layer in the quantum well core layer of the second integrated optical modulation element is $\lambda_{BG}2$, and bandgap wavelength of a barrier layer in the quantum well core layer of the third integrated optical modulation element is $\lambda_{BG}3$, then $\lambda_{LD}1 < \lambda_{LD}2 < \lambda_{LD}3$, and $\lambda_{BG}1 < \lambda_{BG}2 < \lambda_{BG}3$.

21. A method of manufacturing a semiconductor optical element having a plurality of integrated optical modulation elements monolithically integrated on a single semiconductor substrate, wherein the plurality of integrated optical modulation elements includes:

a first integrated optical modulation element having a first laser element portion and a first electric-field-absorption optical modulation portion; and a second integrated optical modulation element having a second laser element portion differing in oscillation wavelength from the first laser element portion and a second electric-field-absorption optical modulation portion, the first electric-field-absorption optical modulation portion having a first quantum well core layer including a barrier layer having a first bandgap wavelength, the second electric-field-absorption optical modulation portion having a second quantum well core layer including a barrier layer having a second bandgap wavelength different from the first bandgap wavelength, the method comprising:

growing the first quantum well core layer on the semiconductor substrate;

forming a mask in a region on the semiconductor substrate, other than a region where the second quantum well core layer is to be grown, and removing the first quantum well core layer by etching; and using the mask, butt-joint growing of the second quantum well core layer on a surface exposed by the etching.

22. The method of manufacturing a semiconductor optical element according to claim 21, wherein when absolute value of difference between the oscillation wavelength of the first laser element portion and the first bandgap wavelength is a first wavelength difference, and when absolute value of difference between the oscillation wavelength of the second laser element portion and the second bandgap wavelength is a second wavelength difference, then the oscillation wavelength of the first laser element portion, the first bandgap wavelength, the oscillation wavelength of the second laser element portion, and the second bandgap wavelength are set to keep difference between the first wavelength difference and the second wavelength difference within a predetermined range.

23. The method of manufacturing a semiconductor optical element according to claim 21, wherein the first quantum well core layer and the second quantum well core layer are i-type quantum well core layers having a ternary mixed crystal or a quaternary mixed crystal composition.

24. A method of manufacturing a semiconductor optical element having a plurality of laser element portions and a plurality of electric-field-absorption optical modulator portions monolithically integrated on a single semiconductor substrate, the method comprising:

growing a quantum well core layer on the semiconductor substrate;

providing a plurality of masks in formation target regions on the quantum well core layer where the plurality of electric-field-absorption optical modulator portions are to be formed;

etching the quantum well core layer in the formation target regions using the plurality of masks; and forming, after the etching, the electric-field-absorption optical modulator portions, with the quantum well core layer being a light absorption layer in the formation target regions, wherein each of the plurality of masks includes a first mask portion extending on the quantum well core layer along the direction of travel of light to be modulated, and a second mask portion extending parallel to the first mask portion, spaced apart from the first mask portion, and equal in width to the first mask portion, on a surface of the semiconductor substrate, the first mask portion and the second mask portion in a first part of the plurality of masks have a first width, the first mask portion and the second mask portion in a second part of the plurality of masks have a second width, different from the first width, when bandgap wavelength of a barrier layer in the quantum well core layer in a first electric-field-absorption optical modulation portion having the quantum well core layer etched with the first mask is a first bandgap wavelength, when oscillation wavelength of the laser element portion from which laser light is applied to the first electric-field-absorption optical modulation portion is a first oscillation wavelength, when bandgap wavelength of a barrier layer in the quantum well core layer in a second electric-field-absorption optical modulation portion having the quantum well core layer etched with the second mask is a second bandgap wavelength, when oscillation wavelength of the laser element portion from which laser light is applied to the second electric-field-absorption optical modulation portion is a second oscillation wavelength, when absolute value of difference between the first bandgap wavelength and the first oscillation wavelength is a first wavelength difference, and when absolute value of difference between the second bandgap wavelength and the second oscillation wavelength is a second wavelength difference, then the first width and the second width are set to keep difference between the first wavelength difference and the second wavelength difference within a predetermined range.

* * * * *